United States Patent
Molnar

(10) Patent No.: US 6,267,644 B1
(45) Date of Patent: Jul. 31, 2001

(54) FIXED ABRASIVE FINISHING ELEMENT HAVING AIDS FINISHING METHOD

(75) Inventor: Charles J Molnar, Wilmington, DE (US)

(73) Assignee: Beaver Creek Concepts Inc, Wilmington, DE (US)

(*) Notice: Subject to any disclaimer, the term of this patent is extended or adjusted under 35 U.S.C. 154(b) by 0 days.

(21) Appl. No.: 09/434,723

(22) Filed: Nov. 5, 1999

Related U.S. Application Data

(60) Provisional application No. 60/111,969, filed on Feb. 6, 1999, and provisional application No. 60/107,301, filed on Nov. 6, 1998.

(51) Int. Cl.$^7$ ...................................................... B24B 1/00
(52) U.S. Cl. ................................ 451/41; 451/449; 451/60
(58) Field of Search ................................ 451/41, 60, 63, 451/287, 449

(56) References Cited

U.S. PATENT DOCUMENTS

| | | |
|---|---|---|
| 5,069,002 | 12/1991 | Sandhu . |
| 5,107,445 | 4/1992 | Jensen . |
| 5,137,544 | 8/1992 | Medellin . |
| 5,154,512 | 10/1992 | Schietinger . |
| 5,166,080 | 11/1992 | Schietinger . |
| 5,196,353 | 3/1993 | Sandhu . |
| 5,232,875 * | 8/1993 | Tuttle et al. .................. 451/63 X |
| 5,308,438 | 5/1994 | Cote . |
| 5,314,843 | 5/1994 | Yu . |
| 5,340,370 | 8/1994 | Cadien . |
| 5,352,277 | 10/1994 | Sasaki ........................... 106/6 |
| 5,413,941 | 5/1995 | Koos . |
| 5,456,627 * | 10/1995 | Jackson et al. ................. 451/63 X |
| 5,595,526 | 1/1997 | Yau . |
| 5,597,442 | 1/1997 | Chen . |
| 5,609,511 | 3/1997 | Moriyama . |
| 5,609,517 | 3/1997 | LoFaro . |
| 5,614,444 | 3/1997 | Farkas . |
| 5,624,300 * | 4/1997 | Kishii et al. .................. 451/63 X |
| 5,639,388 | 6/1997 | Kimura . |
| 5,643,060 | 7/1997 | Sandhu . |
| 5,647,952 | 7/1997 | Chen . |
| 5,667,629 | 9/1997 | Pan . |
| 5,679,063 * | 10/1997 | Kimura et al. .................. 451/60 X |
| 5,685,766 | 11/1997 | Mattingly . |
| 5,695,384 | 12/1997 | Beratan . |
| 5,695,660 | 12/1997 | Lituak . |
| 5,722,879 | 3/1998 | Cronin . |
| 5,728,308 | 3/1998 | Muroyama . |

(List continued on next page.)

FOREIGN PATENT DOCUMENTS

| | | | |
|---|---|---|---|
| WO 98/08919 | 3/1998 | (WO) . | |
| WO 99/64527 | 12/1999 | (WO) | ............... C09G/1/02 |
| WO 00/00561 | 1/2000 | (WO) | ............... C09G/1/02 |
| WO 00/00576 | 1/2000 | (WO) | ............... C09K/3/14 |

OTHER PUBLICATIONS

Berman, Mike et al., "Review of in Situ & in Line Detection for CMP Applic.", Semiconductor Fabtech, 8th Edition, pp 267–274.

Bibby, Thomas, "Endpoint Detection for CMP", Journal of Electronic Materials, vol. 27, #10, 1998, pp 1073–1081.

Primary Examiner—Joseph J. Hail, III
Assistant Examiner—Anthony Ojini

(57) ABSTRACT

A method of using a finishing element having a fixed abrasive finishing surface including boundary lubricants for finishing semiconductor wafers is described. The lubricants in the finishing element are transferred to operative finishing interface a forming lubricating boundary layer. The lubricating boundary layer thickness is controlled to improve finishing and reduce unwanted surface defects. Differential lubricating boundary layer methods are described to differentially finish semiconductor wafers. Planarization and localized finishing can be improved using differential lubricating boundary layer methods of finishing.

38 Claims, 6 Drawing Sheets

U.S. PATENT DOCUMENTS

| | | |
|---|---|---|
| 5,733,176 | 3/1998 | Robinson . |
| 5,733,819 | 3/1998 | Kodama . |
| 5,735,036 | 4/1998 | Barr . |
| 5,738,562 | 4/1998 | Doan . |
| 5,743,784 | 4/1998 | Birang . |
| 5,749,769 | 5/1998 | Church . |
| 5,759,917 | 6/1998 | Grover et al. ............... 438/690 |
| 5,762,537 | 6/1998 | Sandhu . |
| 5,783,489 | 7/1998 | Kaufman . |
| 5,830,280 | 11/1998 | Sato . |
| 5,833,519 | 11/1998 | Moore . |
| 5,842,909 | 12/1998 | Sandhu . |
| 5,858,813 | 1/1999 | Scherber . |
| 5,860,847 | 1/1999 | Sakurai et al. ............... 451/10 |
| 5,876,266 | 3/1999 | Miller . |
| 5,876,470 | 3/1999 | Ronay ............... 106/3 |
| 5,885,137 | 3/1999 | Ploessl . |
| 5,885,334 | 3/1999 | Suzuki . |
| 5,906,754 | 5/1999 | Appel . |
| 5,910,041 | 6/1999 | Duescher . |
| 5,916,855 | 6/1999 | Avanzino . |
| 5,919,082 | 7/1999 | Walker . |
| 5,934,978 | 8/1999 | Burke . |
| 5,954,347 | 8/1999 | Wright . |
| 5,954,975 | 9/1999 | Cadien . |
| 5,954,977 | 9/1999 | Kaufman et al. ............... 252/79.1 |
| 5,954,997 | 9/1999 | Kaufman . |
| 5,958,794 | 9/1999 | Bruxuoort . |
| 5,968,280 | 10/1999 | Ronay . |
| 5,972,793 | 10/1999 | Tseng . |
| 5,985,045 | 11/1999 | Kobayashi . |
| 5,993,298 | 11/1999 | Duescher ............... 451/56 |
| 6,121,143 | 9/2000 | Messner et al. ............... 438/692 |

\* cited by examiner

FIXED ABRASIVE FINISHING ELEMENT HAVING AIDS FINISHING METHOD

This application claims the benefit of Provisional Application Ser. No. 60/107,301 filed on Nov. 6, 1998 entitled "Method of finishing with a fixed abrasive finishing element having finishing aids"; and Provisional Application Ser. No. 60/111,969 filed on Feb. 6, 1999 entitled "Finishing semiconductor wafers with a multi-layer fixed abrasive finishing element having finishing aids". Provisional Applications which this application claims benefit to are included herein by reference in their entirety.

BACKGROUND ART

Chemical mechanical polishing (CMP) is generally known in the art. For example U.S. Pat. No. 5,177,908 to Tuttle issued in 1993 describes a finishing element for semiconductor wafers, having a face shaped to provide a constant, or nearly constant, surface contact rate to a workpiece such as a semiconductor wafer in order to effect improved planarity of the workpiece. U.S. Pat. No. 5,234,867 to Schultz et. al. issued in 1993 describes an apparatus for planarizing semiconductor wafers which in a preferred form includes a rotatable platen for polishing a surface of the semiconductor wafer and a motor for rotating the platen and a non-circular pad is mounted atop the platen to engage and polish the surface of the semiconductor wafer. Fixed abrasive finishing elements are known for polishing semiconductor layers. An example is WO 98/18159 PCT application by Minnesota Mining and Manufacturing.

An objective of polishing of semiconductor layers is to make the semiconductor layers as nearly perfect as possible. Fixed abrasive finishing pad finishing surfaces can suffer from being overly harsh on a workpiece causing unwanted scratching or other unwanted surface damage thus reducing the perfection of the surface. Further, a fixed abrasive finishing pad finishing surface can suffer from having a higher than necessary friction when finishing a workpiece. This higher than necessary friction can lead to other unwanted surface damage. Further, fixed abrasive finishing pads can have abrasive particles unexpectedly break away from their surface during finishing and these broken away abrasive particles can scratch or damage the workpiece surface. Still further, during finishing a particle can break away from the workpiece surface forming a workpiece abrasive particle which can scratch or damage the workpiece surface. These unwanted effects are particularly important and deleterious to yield when manufacturing electronic wafers which require extremely close tolerances in required planarity and feature sizes.

It is an advantage of this invention to reduce the harshness of fixed abrasive finishing pads on the workpiece surface being finished. It is an advantage of this invention to reduce unwanted scratching or other unwanted surface damage on the workpiece surface during finishing. It is further an advantage of this invention to reduce the friction during finishing to help reduce unwanted surface damage. It is an advantage of this invention to reduce unwanted damage to the workpiece surface when during finishing with a fixed abrasive finishing element an abrasive particle unexpectedly breaks away from their surface. It is an advantage of the invention to reduce unwanted damage to the workpiece surface when an abrasive workpiece particle breaks away workpiece surface during finishing. It is further an advantage of this invention to help improve yield for workpieces having extremely close tolerances such as semiconductor wafers.

These and other advantages of the invention will become readily apparent to those of ordinary skill in the art after reading the following disclosure of the invention.

BRIEF DESCRIPTION OF DRAWING FIGURES

REFERENCE NUMERALS IN DRAWINGS

Figure 1:
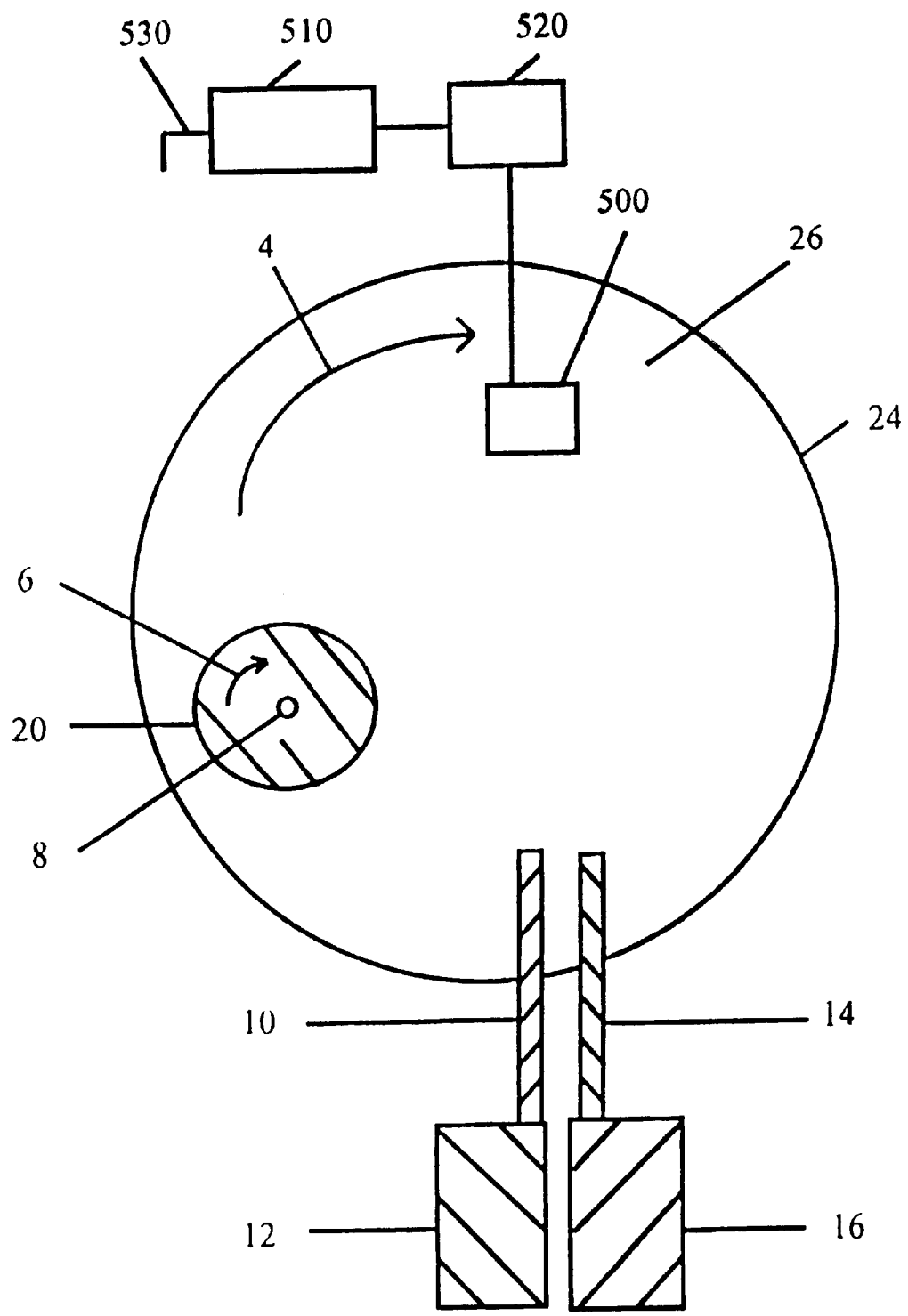
FIG. 1 is an artist's drawing of the interrelationships of the different materials when finishing according to this invention.

Reference Numeral 4 direction of rotation of the finishing element finishing surface Reference Numeral 6 direction of rotation of the workpiece being finished Reference Numeral 8 center of the rotation of the workpiece Reference Numeral 10 finishing composition feed line for adding finishing chemicals Reference Numeral 12 reservoir of finishing composition Reference Numeral 14 alternate finishing composition feed line for adding alternate finishing chemicals Reference Numeral 16 a reservoir of alternate finishing composition Reference Numeral 16 rotating carrier for the workpiece Reference Numeral 18 operative contact element Reference Numeral 20 workpiece Reference Numeral 21 workpiece surface facing away from the workpiece surface being finished.

Reference Numeral 22 surface of the workpiece being finished

Reference Numeral 23 raised surface perturbation

Reference Numeral 24 finishing element

Reference Numeral 25 fixed abrasive particles proximate the finishing element finishing surface.

Reference Numeral 26 finishing element finishing surface

Reference Numeral 27 finishing aid in the form of discrete regions

Reference Numeral 28 finishing element surface facing away from workpiece surface being finished Reference Numeral 29 finishing element surface layer Reference Numeral 30 finishing element subsurface layer Reference Numeral 31 finishing composition Reference Numeral 32 operative finishing motion Reference Numeral 33 pressure applied to the operative finishing interface substantially perpendicular to the finishing motion Reference Numeral 40 platen Reference Numeral 42 surface of the platen facing the finishing element Reference Numeral 44 surface of the platen facing away from the finishing element Reference Numeral 54 base support structure Reference Numeral 56 surface of the base support structure facing the platen Reference Numeral 60 carrier housing Reference Numeral 62 pressure distributive element Reference Numeral 800 portion of a semiconductor wafer surface having two unwanted raised regions.

Reference Numeral 802 unwanted raised regions on the semiconductor surface being finished.

Reference Numeral 804 lower local regions on the semiconductor surface being finished proximate to the unwanted raised regions.

Reference Numeral 810 finishing surface contacting unwanted raised regions

Reference Numeral 812 finishing element surface local region displaced from but proximate to and lower than the unwanted raised local regions.

Reference Numeral 900 boundary layer lubrication.

Reference Numeral 902 thinner regions of boundary layer lubrication

Reference Numeral 904 thicker regions of boundary layer lubrication

SUMMARY OF INVENTION

A preferred embodiment of this invention is directed to a method of finishing of a semiconductor wafer surface being finished comprising the step of providing a finishing element having a fixed abrasive finishing surface and having a organic boundary lubricant therein which is free of encapsulating films; the step of positioning the semiconductor wafer surface being finished proximate to the finishing surface; the step of applying an operative finishing motion in the operative finishing interface; and wherein applying the operative finishing motion transfers the organic boundary lubricant from the finishing surface to the operative finishing interface in a manner that forms an organic lubricating boundary layer of from 1 to 6 molecules thick.

Other preferred embodiments of my invention are described herein.

DETAILED DESCRIPTION OF PREFERRED EMBODIMENTS OF THE INVENTION

The book *Chemical Mechanical Planarization of Microelectric Materials* by Steigerwald, J. M. et al published by John Wiley & Sons, ISBN 0471138274 generally describes chemical mechanical finishing and is included herein by reference in its entirety for general background. In chemical mechanical finishing the workpiece is generally separated from the finishing element by a polishing slurry. The workpiece surface being finished is in parallel motion with finishing element finishing surface disposed towards the workpiece surface being finished. The abrasive particles such as found in a polishing slurry interposed between these surfaces finish the workpiece.

Figure 2:
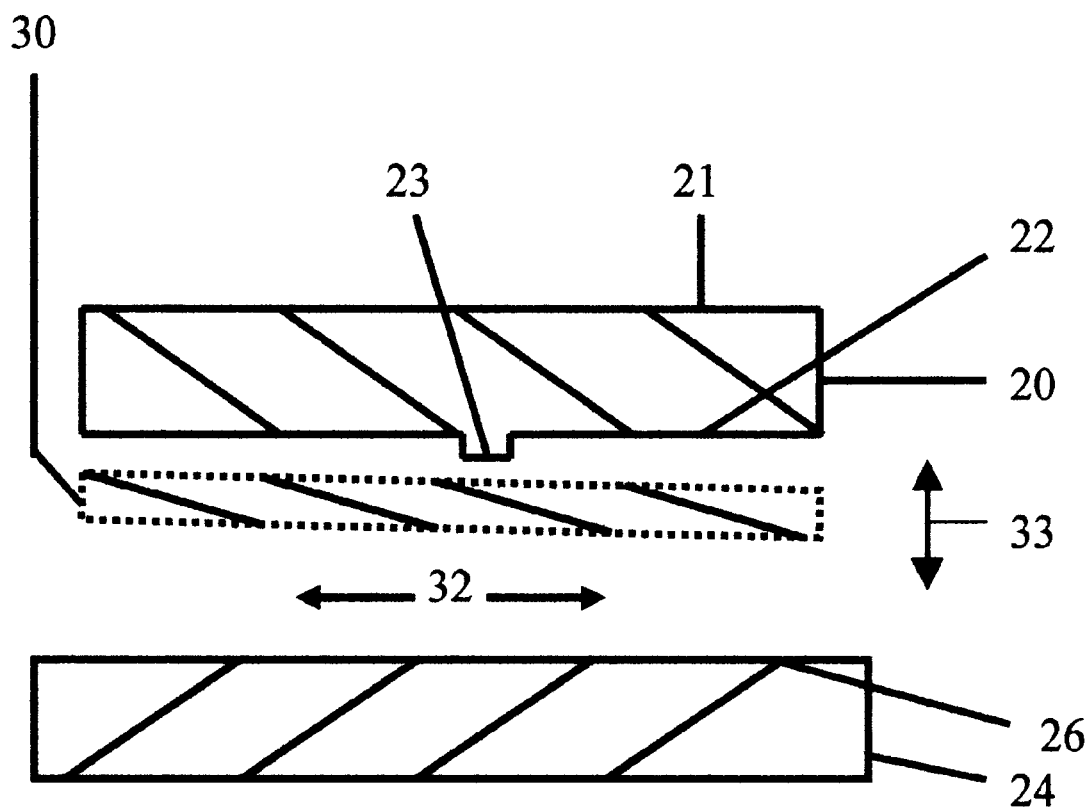
FIG. 2 is an artist's drawing of a particularly preferred embodiment of this invention including the interrelationships of the different objects when finishing according to this invention.
Figure 3:
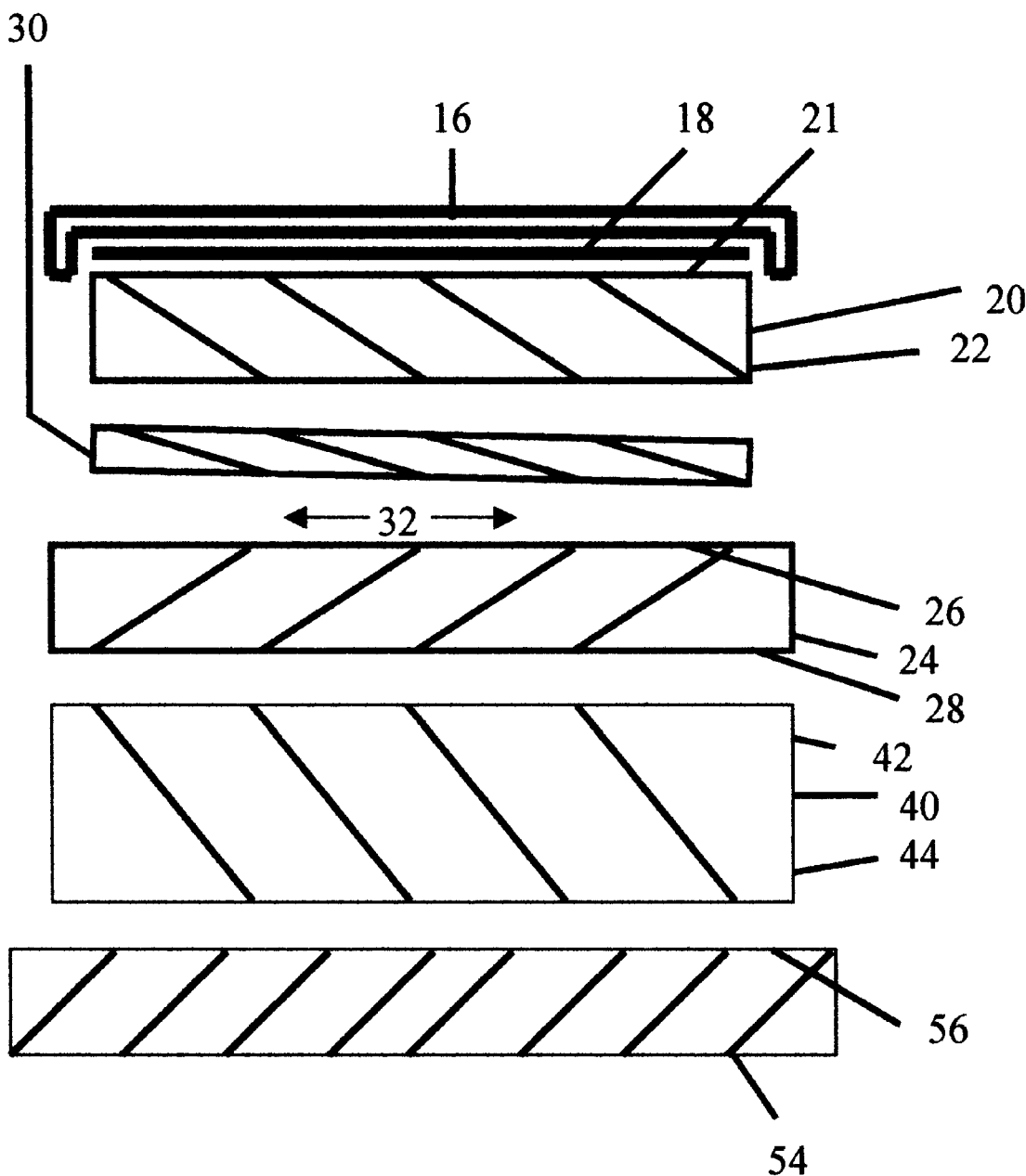
FIG. 3 is an closeup drawing of a preferred embodiment of this invention

Discussion of some of the terms useful to aid in understanding this invention are now presented. Finishing is a term used herein for both planarizing and polishing. Planarizing is the process of making a surface which has raised surface perturbations or cupped lower areas into a planar surface and thus involves reducing or eliminating the raised surface perturbations and cupped lower areas. Planarizing changes the topography of the work piece from non planar to ideally perfectly planar. Polishing is the process of smoothing or polishing the surface of an object and tends to follow the topography of the workpiece surface being polished. A finishing element is a term used herein to describe a pad or element for both polishing and planarizing. A finishing element finishing surface is a term used herein for a finishing element surface used for both polishing and planarizing. A finishing element planarizing surface is a term used herein for a finishing element surface used for planarizing. A finishing element polishing surface is a term used herein for a finishing element surface used for polishing. Workpiece surface being finished is a term used herein for a workpiece surface undergoing either or both polishing and planarizing. A workpiece surface being planarized is a workpiece surface undergoing planarizing. A workpiece surface being polished is a workpiece surface undergoing polishing. The finishing cycle time is the elapsed time in minutes that the workpiece is being finished. A portion of a finishing cycle time is about 5% to 95% of the total finishing cycle time in minutes and a more preferred portion of a finishing cycle time is 10% to 90% of the total finishing cycle time in minutes. The planarizing cycle time is the elapsed time in minutes that the workpiece is being planarized. The polishing cycle time is the elapsed time in minutes that the workpiece is being polishing. FIGS. 1–3 are now discussed to better illustrate the invention.

As used herein, an emulsion is a fluid containing a microscopically heterogeneous mixture of two (2) normally immiscible liquid phases, in which one liquid forms minute droplets suspended in the other liquid. As used herein, a surfactant is a surface active substance, i. e., alters (usually reduces) the surface tension of water. Non limiting examples of surfactants include ionic, nonionic, and cationic. As used herein, a lubricant is an agent that reduces friction between moving surfaces. A hydrocarbon oil is a non limiting example. As used herein, soluble means capable of mixing with a liquid (dissolving) to form a homogeneous mixture (solution).

As used herein, a dispersion is a fluid containing a microscopically heterogeneous mixture of solid phase material dispersed in a liquid and in which the solid phase material is in minute particles suspended in the liquid. As used herein, a surfactant is a surface active substance, i. e., alters (usually reduces) the surface tension of water. Non limiting examples of surfactants include ionic, nonionic, and cationic. As used herein, a lubricant is an agent that reduces friction between moving surfaces. As used herein, soluble means capable of mixing with a liquid (dissolving) to form a homogeneous mixture (solution).

As used herein, a die is one unit on a semiconductor wafer generally separated by scribe lines. After the semiconductor wafer fabrication steps are completed, the die are separated into units generally by sawing. The separated units are generally referred to as "chips". Each semiconductor wafer generally has many die which are generally rectangular. The terminology semiconductor wafer and die are generally known to those skilled in the arts. As used herein, within die uniformity refers to the uniformity of within the die. As used herein, local planarity refers to die planarity unless specifically defined otherwise. Within wafer uniformity refers to the uniformity of finishing of the wafer. As used herein, wafer planarity refers to planarity across a wafer. Multiple die planarity is the planarity across a defined number of die. As used herein, global wafer planarity refers to planarity across the entire semiconductor wafer planarity. Planarity is important for the photolithography step generally common to semiconductor wafer processing, particularly where feature sizes are less than 0.25 microns. As used herein, a device is a discrete circuit such as a transistor, resistor, or capacitor. As used herein, pattern density is ratio of the raised (up) area in square millimeters to the to area in square millimeters of region on a specific region such as a die or semiconductor wafer. As used herein, pattern density is ratio of the raised (up) area in square millimeters to the total area in square millimeters of region on a specific region such as a die or semiconductor wafer. As used herein, line pattern density is the ratio of the line width to the pitch. As used herein, pitch is line width plus the oxide space. As an illustrative example, pitch is the copper line width plus the oxide spacing. Oxide pattern density, as used herein, is the volume fraction of the oxide within an infinitesimally thin surface of the die.

FIG. 1 is an artist's drawing of a particularly preferred embodiment of this invention when looking from a top down perspective including the interrelationships of some important objects when finishing according to the method of this invention. Reference Numeral 24 represents the abrasive finishing element. Reference Numeral 26 represents the abrasive finishing element finishing surface. Reference Numeral 4 represents the direction of rotation of the finishing element finishing surface. Reference Numeral 20 represents the workpiece being finished. The workpiece surface facing the finishing element finishing surface is the workpiece surface being finished. Reference Numeral 6 represents the direction of rotation of the workpiece being finished. Reference Numeral 8 is the center of the rotation of the workpiece. Reference Numeral 10 represents a finishing composition feed line for adding other chemicals to the surface of the workpiece such as acids, bases, buffers, other chemical reagents, and the like. The finishing composition feed line can have a plurality of exit orifices. Reference Numeral 12 represents a reservoir of finishing composition to be fed to finishing element finishing surface. Not shown is the feed mechanism for the finishing composition such as a variable pressure or a pump mechanism. Supplying a finishing composition without abrasives is preferred and supplying a finishing composition without abrasive particles is more preferred for some applications such as where a fixed abrasive finishing element finishing surface is used for finishing. Supplying a lubricant which is free of an encapsulating film or encapsulating thin resin structure is preferred. Encapsulating lubricants is an expensive and complex step which is unnecessary in this invention. Further, encapsulated lubricants tend to burst on breaking and can deliver higher than desired localized lubricants to regions. Further, the encapsulated lubricants can prematurely burst releasing their contents during manufacture of the slurry and/or finishing element. This can contaminate the slurry and/or finishing element and adversely affect their respective finishing performance. Reference Numeral 14 represents an alternate finishing composition feed line for adding a finishing chemicals composition to the finishing element finishing surface to improve the quality of finishing. Reference Numeral 16 represents an alternate finishing composition reservoir of chemicals to be, optionally, fed to finishing element finishing surface. Not shown is the feed mechanism for the alternate finishing composition such as a variable pressure or a pump mechanism. A preferred embodiment of this invention is to feed liquids from the finishing composition line and the alternate finishing composition feed line which are free of abrasive particles. Another preferred embodiment, not shown, is to have a wiping element, preferably an elastomeric wiping element, to uniformly distribute the finishing composition(s) across the finishing element finishing surface. Nonlimiting examples of some preferred dispensing systems and wiping elements is found in U.S. Pat. No. 5,709,593 to Guthrie et. al., U.S. Pat. No. 5,246,525 to Junichi, and U.S. Pat. No. 5,478,435 to Murphy et. al. and are included herein by reference in their entirety for general guidance and appropriate modifications by those generally skilled in the art for supplying lubricating aids. Reference Numeral 500 represents a operative sensor. An energy change sensor is a preferred operative sensor. Reference numeral 510 represents a processor. Reference Numeral 520 represents a controller. Reference Numeral 530 represents the operative connections for controlling. Illustrative preferred examples include controlling the operative finishing motion. Further examples are discussed herein below. FIGS. 2 and 3 will now provide an artists' expanded view of some relationships between the workpiece and the fixed abrasive finishing element.

FIG. 2 is an artist's closeup drawing of the interrelationships of some of the important aspects when finishing according to a preferred embodiment of this invention. Reference Numeral 20 represents the workpiece. Reference Numeral 21 represents the workpiece surface facing away from the workpiece surface being finished. Reference Numeral 22 represents the surface of the workpiece being finished. Reference Numeral 23 represents a high region (unwanted raised region) on the workpiece surface being finished. During finishing, the high region is preferably substantially removed and more preferably, the high region is removed and surface polished. Reference Numeral 24 represents the abrasive finishing element having a finishing aid contained therein. A fixed abrasive finishing element having a finishing aid comprising a polymeric lubricating aid at least partially dispersed therein is particularly preferred. Reference Numeral 26 represents the surface of the finishing element facing the workpiece and is often referred to herein as the finishing element finishing surface. An abrasive finishing surface is a preferred finishing element finishing surface and a fixed abrasive finishing surface is a more preferred finishing element finishing surface. Reference Numeral 30 represents a finishing composition and optionally, the alternate finishing composition disposed between the workpiece surface being finished and finishing element finishing surface. The interface between the workpiece surface being finished and the finishing element finishing surface is often referred to herein as the operative finishing interface. A finishing composition comprising a water based composition is preferred. A finishing composition comprising an water based composition which is substantially free of abrasive particles is preferred. The workpiece surface being finished is in operative finishing motion relative to the finishing element finishing surface. The workpiece surface being finished in operative finishing motion relative to the finishing element finishing surface is an example of a preferred operative finishing motion. Reference Numeral 32 represents a preferred operative finishing motion between the surface of the workpiece being finished and finishing element finishing surface. Reference Numeral 33 represents a pressure applied to the operative interface perpendicular to operative finishing motion.

FIG. 3 is an artist's closeup drawing of a preferred embodiment of this invention showing some further interrelationships of the different objects when finishing according to the method of this invention. Reference Numeral 16 represents a carrier for the workpiece and in this particular embodiment, the carrier is a rotating carrier. The rotating carrier is operable to rotate the workpiece against the finishing element which rests against the platen and optionally has a motor. Optionally, the rotating carrier can also be designed to move the workpiece laterally, in an arch, figure eight, or orbitally to enhance uniformity of polishing. The workpiece is in operative contact with the rotating carrier and optionally, has an operative contact element (Reference Numeral 18) to effect the operative contact. An illustrative example of an operative contact element is a workpiece held in place to the rotating carrier with a bonding agent (Reference Numeral 18). A hot wax is an illustrative example of a preferred bonding agent. Alternately, a porometric film can be placed in the rotating carrier having a recess for holding the workpiece. A wetted porometric film (Reference Numeral 18) will hold the workpiece in place by surface tension. An adherent thin film is another preferred example of placing the workpiece in operative contact with the rotating carrier. Reference Numeral 20 represents the workpiece. Reference Numeral 21 represents the workpiece surface facing away from the workpiece surface being finished. Reference Numeral 22 represents the surface of the workpiece being finished. Reference Numeral 24 represents the finishing element. Reference Numeral 26 represents the finishing element finishing surface. Reference Numeral 28 represents the surface of the finishing element facing away from the workpiece surface being finished. Reference Numeral 31 represents the finishing composition and optionally, the alternate finishing composition supplied between the workpiece surface being finished and surface of the finishing element facing the workpiece. For some applications the finishing composition and the alternate finishing composition can be combined into one feed stream, preferably free of abrasive particles. Reference Numeral 32 represents a preferred direction of the operative finishing motion between the surface of the workpiece being finished and the finishing element finishing surface. Reference Numeral 40 represents the platen or support for the finishing element. The platen can also have an operative finishing motion relative to the workpiece surface being finished. Reference Numeral 42 represents the surface of the platen facing the finishing element. The surface of the platen facing the finishing element is in support contact with the finishing element surface facing away from the workpiece surface being finished. The finishing element surface facing the platen can, optionally, be connected to the platen by adhesion. Frictional forces between the finishing element and the platen can also retain the finishing element against the platen. Reference Numeral 44 is the surface of the platen facing away from the finishing element. Reference Numeral 54 represents the base support structure. Reference Numeral 56 represents the surface of the base support structure facing the platen. The rotatable carrier (Reference Number 16) can be operatively connected to the base structure to permit improved control of pressure application at the workpiece surface being finished (Reference Numeral 22).

A fixed abrasive finishing element finishing surface tends to have a higher friction than necessary with the workpiece being finished. The higher friction can lead to higher than necessary energy for finishing. The higher friction can lead to destructive surface forces on the workpiece surface which cause deleterious surface damage to the workpiece. The higher friction can lead to premature wear on the finishing element and the abrasive particles themselves. This premature wear on the finishing element and abrasive particles themselves can unnecessarily increase the cost of finishing a workpiece. Forming an organic lubricating boundary layer is a preferred method to reduce the wear on the exposed fixed abrasive finishing surface during finishing. The this higher than necessary friction can lead to higher than necessary changes in performance of the finishing element finishing surface during the finishing of a plurality of workpieces which makes process control more difficult and/or complex. Applicant currently believes that the higher than desirable defects in the workpiece surface being finished can at least partially due to the fact that the abrasive particles in a previous fixed abrasive finishing elements tend to scratch or gouge the surface because they are not free to move as compared to abrasive particles in a fluid slurry which are free to roll and move during finishing. Further, since the fixed abrasive finishing element has fixed abrasive particles in a constant relative position versus the workpiece surface being finished, applicant believes it is easier for finishing surface of the abrasive particles to become dull or less effective at finishing the workpiece surface being finished when compared to abrasive particles in a slurry. Each of the above situations can lead to less than desirable surface quality on the workpiece surface being finished and earlier than necessary wear on the expensive fixed abrasive finishing element finishing surface. Applicant currently believes that proper choice of a finishing aid, more preferably a lubricating aid, at or proximate the surface of the finishing element finishing surface can reduce or eliminate the high tendency to scratch and/or damage workpiece surface being finished. Applicant currently believes that proper choice and supply of a finishing aid, more preferably a lubricating aid, from the finishing element to the interface of the workpiece surface being finished and the finishing element finishing surface can reduce or eliminate the negative effects of high friction such as chatter. Applicant currently believes that proper choice and supply of a finishing aid to the interface of the workpiece surface being finished and the finishing element finishing surface can extend the useful life of the finishing element finishing surface by reducing erosive and other wear forces. A finishing aid, more preferably a lubricating aid, reduces the wear to the tips of the abrasive particles due to attrition wear and tribochemical wear. Thus the lubricating aid can help to maintain the "cutting ability" of the abrasive particles. Supplying the lubricating aid at the point of use from the finishing element finishing surface can reduce or prevent negative interactions between the finishing composition and any lubricating aid which might be added to the finishing composition (and optional slurry particles therein). Supplying the lubricating aid from the finishing element finishing surface can further reduce the of chatter, micro localized distortions in the finishing element finishing surface, and also increases the uniformity of finishing across the surface of the workpiece surface being finished. Preferably the lubricating aid is dispersed proximate the finishing element finishing surface and more preferably, the lubricating aid is dispersed substantially uniformly proximate the finishing element finishing surface. Supplying an organic boundary lubricant to the operative finishing interface (located between finishing element finishing surface and the workpiece surface being finished) further reduces risks of chatter, micro localized distortions in the finishing element finishing surface, and also increases the uniformity of finishing across the surface of the workpiece surface being finished. Forming the lubricating boundary layer differentially can improve local planarity and enhance finishing flexibility as discussed herein. Lubrication reduces abrasive wear to the abrasive particles and to the finishing element finishing surface by reducing friction forces. Differential boundary lubrication can enhance localized finishing rates to improve the semiconductor wafer surface. Lubrication reduces breaking away of the abrasive particles from the surface of the fixed abrasive finishing element by reducing friction forces. Lubrication reduces the friction which can reduce adverse forces particularly on a high speed belt fixed abrasive finishing element which under high friction can cause belt chatter, localized belt stretching, and/or belt distortions, high tendency to scratch and/or damage workpiece surface being finished. Localized and or micro localized distortions to the surface of a fixed abrasive finishing element and chatter can also occur with other finishing motions and/elements and lubrication can reduce or eliminate these.

Supplying of finishing aid from the finishing element finishing surface to the interface of the workpiece surface being finished and the finishing element finishing surface to extend the finishing element finishing surface useful life is preferred. Supplying of finishing aid from the finishing element finishing surface to the interface of the workpiece surface being finished and the finishing element finishing surface to reduce unwanted surface defects in the workpiece surface being finished is preferred. Supplying of finishing aid from the finishing element finishing surface to the interface of the workpiece surface being finished and the finishing element finishing surface to reduce unwanted breaking away of abrasive particles from the fixed abrasive finishing element finishing surface is preferred. Supply of lubricant at the point of use is preferred and supply of lubricant with a substantially uniform way to the operative finishing interface at the point of use is currently more preferred. An effective amount of finishing aid from the finishing element finishing surface often can help meeting a plurality of these objectives simultaneously. Supply of a thin lubricating boundary layer is particularly preferred. An effective amount of boundary lubricant often can help meeting a plurality of these advantages simultaneously.

The new problem recognition and unique solution are new and considered part of this current invention.

Fixed abrasive finishing element

Figure 4:
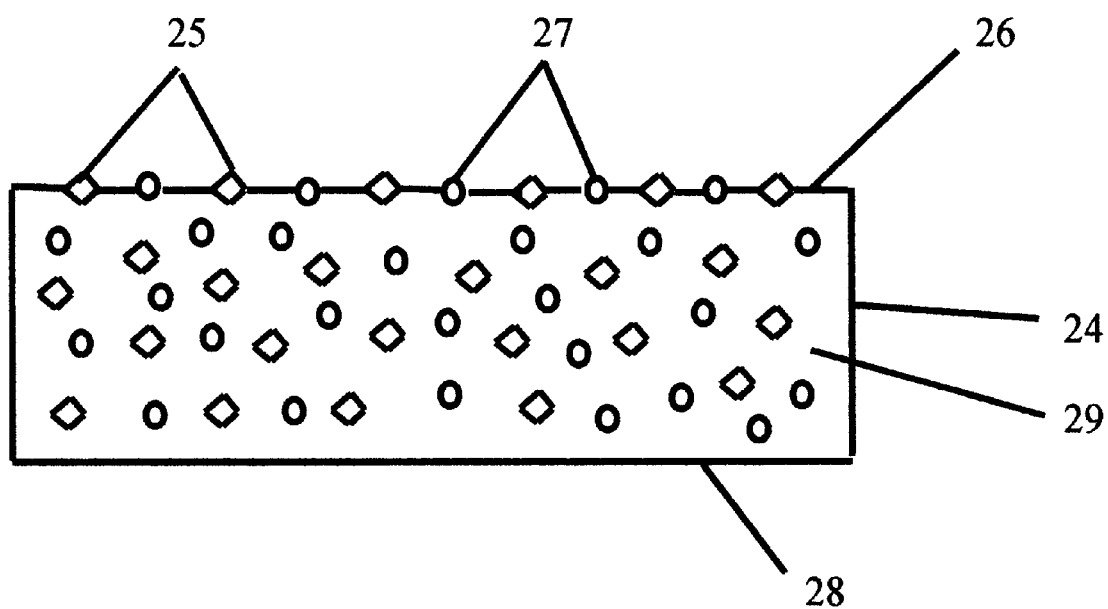
FIG. 4 is cross-sectional view of a fixed abrasive finishing element

FIG. 4 represents an artist's cross-sectional view of a preferred embodiment of a multi-layer fixed abrasive finishing element according to this invention. Reference Numeral 24 represents the finishing element finishing surface layer. Reference Numeral 26 represents the finishing element finishing surface. Reference Numeral 28 represents the surface of the finishing element surface layer facing away from the workpiece surface being finished. Reference Numeral 25 represents the fixed abrasive particles proximate the finishing element finishing surface. Preferably the fixed abrasive particles are dispersed in the finishing element finishing surface layer and more preferably, the fixed abrasive particles are uniformly dispersed in the finishing element finishing surface layer. Reference Numeral 27 represents the finishing aid which in this embodiment is shown in the form of discrete regions in the finishing element finishing surface layer. A finishing element finishing surface layer having finishing aids dispersed in the finishing element finishing surface layer is preferred and a finishing element finishing surface layer having finishing aids uniformly dispersed in the finishing element finishing surface layer is more preferred. A finishing aid molecularly dispersed in the finishing element is a preferred type of dispersion. A finishing aid having a plurality of discrete regions in the finishing element finishing surface layer is a particularly preferred form of dispersion and a finishing aid having dispersed discrete, unconnected finishing aid particles therein is a more particularly preferred form of dispersion in the finishing element finishing surface layer. Reference Numeral 29 represents a finishing element finishing surface layer. Reference numeral 30 represents a finishing element subsurface layer. A particularly preferred finishing element subsurface layer is free of lubricant. A finishing element subsurface layer free of lubricant is often a lower cost preferred reinforcement layer for the finishing element. A finishing element surface layer and a finishing element subsurface layer comprising an synthetic organic polymer is preferred. A finishing element finishing surface comprising binder resin is also preferred. A preferred optional stabilizing filler dispersed in the finishing element surface layer is not shown in this particular embodiment. A preferred stabilizing filler is a fibrous filler. An optional reinforcing layer is not shown in this particular embodiment. A preferred finishing element subsurface layer useful for a reinforcing layer can be a synthetic resin fabric, a woven fabric, a reinforcing film, or reinforcing sheet integral with or bonded to the finishing element body.

A finishing element having fixed abrasives for finishing high precision workpieces is known. As used herein, a fixed abrasive finishing element is a integral abrasive finishing element. The integral abrasive finishing element having abrasive particles connected to at least the surface of the finishing element finishing surface layer is preferred. The integral abrasive finishing element surface layer having abrasive particles connected to at least the surface of the finishing element and which is substantially free of unconnected abrasive particles except for those formed during the actual planarizing and/or polishing process itself is more preferred. A three dimensional fixed abrasive finishing element surface layer as used herein is a fixed abrasive finishing element surface layer having multiple abrasive particles dispersed throughout at least a portion of its thickness, such that if some of the surface is removed additional abrasive particles are exposed on the newly exposed surface. A three dimensional fixed abrasive finishing element surface layer is particularly preferred. A three dimensional fixed abrasive finishing element surface layer having multiple abrasive particles substantially uniformly dispersed throughout at least a portion of its thickness such that if some of the surface is removed another region of substantially uniformly dispersed abrasive particles are exposed on the newly exposed surface is preferred. A three dimensional fixed abrasive finishing element surface layer having multiple abrasive particles uniformly dispersed throughout at least as portion of its thickness such that if some of the surface is removed another region of uniformly dispersed abrasive particles are exposed on the newly exposed surface is more preferred. A fixed abrasive finishing element surface layer which applies a substantially uniform distribution of abrasive particles over the workpiece surface being finished is preferred and a fixed abrasive finishing element surface layer which applies a uniform distribution of abrasive particles over the workpiece surface being finished is more preferred.

A fixed abrasive finishing element surface layer and a finishing element subsurface layer free of finishing aids comprising a synthetic polymeric is preferred. A synthetic polymeric layer comprising at least one material selected from the group consisting of an organic synthetic polymer, an inorganic polymer, and combinations thereof is preferred. A preferred example of organic synthetic polymer is an thermoplastic polymer. Another preferred example of an organic synthetic polymer is a thermoset polymer. An organic synthetic polymeric body comprising organic synthetic polymers including materials selected from the group consisting of polyurethanes, polyolefins, polyesters, polyamides, polystyrenes, polycarbonates, polyvinyl chlorides, polyimides, epoxies, chloroprene rubbers, ethylene propylene elastomers, butyl polymers, polybutadienes, polyisoprenes, EPDM elastomers, and styrene butadiene elastomers is preferred. Preferred stiff finishing surfaces can comprise polyphenylene sulfide, polysulfone, and polyphenylene oxide polymers. Phenolic polymers can also be used. Polyolefin polymers are particularly preferred for their generally low cost. A preferred polyolefin polymer is polyethylene. Another preferred polyolefin polymer is a propylene polymer. Another preferred polyolefin polymer is a ethylene propylene copolymer. Copolymer organic synthetic polymers are also preferred. Polyurethanes are preferred for the inherent flexibility in formulations. A finishing element comprising a foamed organic synthetic polymer is particularly preferred because of their flexibility and ability to transport the finishing composition. A finishing element comprising a foamed polyurethane polymer is particularly preferred. Foaming agents and processes to foam organic synthetic polymers are generally known in the art. A finishing element comprising a compressible porous material is preferred and comprising a organic synthetic polymer of a compressible porous material is more preferred.

A finishing element finishing surface layer substantially uniform waymixture of a plurality of organic synthetic polymers can be particularly tough, wear resistant, and useful. An organic synthetic polymeric finishing element finishing surface comprising a plurality of organic synthetic polymers and wherein the major component is selected from materials selected from the group consisting of polyurethanes, polyolefins, polyesters, polyamides, polystyrenes, polycarbonates, polyvinyl chlorides, polyimides, epoxies, chloroprene rubbers, ethylene propylene elastomers, butyl polymers, polybutadienes, polyisoprenes, EPDM elastomers, and styrene butadiene elastomers is preferred. Preferred stiff finishing surfaces can comprise polyphenylene sulfide, polysulfone, and polyphenylene oxide resins. Phenolic resins can also be used. The minor component is preferably also an organic synthetic polymer and is preferably a modifying and/or toughening agent. A preferred example of an organic synthetic polymer modifier is a material which reduces the hardness or flex modulus of the finishing element body such an polymeric elastomer. A compatibilizing agent can also be used to improve the physical properties of the polymeric mixture. Compatibilizing agents are often also synthetic polymers and have polar and/or reactive functional groups such as carboxylic acid, maleic anhydride, and epoxy groups. Organic synthetic polymers of the above descriptions are generally available commercially. Illustrative nonlimiting examples of commercial suppliers of organic synthetic polymers include Exxon Co., Dow Chemical, Sumitomo Chemical, and BASF.

A fixed abrasive finishing element comprising a synthetic polymer composition having a plurality of layers is preferred. A fixed abrasive finishing element comprising at least one layer of a soft synthetic polymer is preferred. A fixed abrasive finishing element comprising at least one layer of a elastomeric synthetic polymer is preferred. A fixed abrasive finishing element comprising at least one layer of a thermoset elastomeric synthetic polymer is preferred.

Further illustrative nonlimiting examples of preferred finishing elements for use in the invention are also discussed. A finishing element having at least a layer of an elastomeric material having a Shore A hardness of at least 30 A is preferred. ASTM D 676 is used to measure hardness. A porous finishing element is preferred to more effectively transfer the polishing slurry to the surface of the workpiece being finished. A finishing element comprising a synthetic resin material is preferred. A finishing element comprising a thermoset resin material is more preferred. A finishing element having layers of different compositions is preferred to improve the operative finishing motion on the workpiece surface being finished. As an example, a finishing element having two layers, one a hard layer and one a soft layer, can better transfer the energy of operative finishing motion to the workpiece surface being finished than a similar thickness finishing element of only a very soft layer. A thermoset synthetic resin is less prone to elastic flow and thus is more stable in this application. A finishing element which is thin is preferred because it generally transfers the operative finishing motion to the workpiece surface being finished more efficiently. A finishing element having a thickness from 0.5 to 0.002 cm is preferred and a thickness from 0.3 to 0.005 cm is more preferred and a finishing element having a thickness from 0.2 to 0.01 cm is even more preferred. Current synthetic resin materials can be made quite thin now. The minimum thickness will be determined by the finishing element's integrity and longevity during polishing which will depend on such parameters as tensile and tear strength. A finishing element having sufficient strength and tear strength for chemical mechanical finishing is preferred.

An abrasive finishing element having a flex modulus in particular ranges is also preferred. An abrasive finishing element having a high flex modulus is generally more efficient for planarizing. An abrasive finishing element having a low flex modulus is generally more efficient for polishing. Further a continuous belt fixed abrasive finishing element can have a different optimum flex modulus than a fixed abrasive finishing element disk. One also needs to consider the workpiece surface to be finished in selecting the flex modulus. A fixed abrasive finishing element comprising a synthetic resin having flex modulus of at most 1,000,000 psi is preferred and having flex modulus of at most 800,000 psi is more preferred and 500,000 psi is more preferred. Pounds per square in is psi. Flex modulus is preferably measured with ASTM 790 B at 73 degrees Fahrenheit. Fixed abrasive finishing elements comprising a synthetic resin having a very low flex modulus are also generally known to those skilled in the art such as elastomeric polyurethanes which can also be used. A finishing element having a flex modulus of greater than 1,000,000 psi can be preferred for some particular planarizing applications.

For some embodiments, polishing pad designs and equipment such as in U.S. Pat. No. 5,702,290 to Leach, a polishing pad having a high flexural modulus can be effective and preferred. A finishing element having a continuous phase of material imparting resistance to local flexing is preferred. A preferred continuous phase of material is a synthetic polymer, more preferably an organic synthetic polymer. An organic synthetic polymer having a flexural modulus of at least 50,000 psi is preferred and having a flexural modulus of at least 100,000 psi is more preferred and having a flexural modulus of at least 200,000 psi is even more preferred for the continuous phase of synthetic polymer in the finishing element. An organic synthetic polymer having a flexural modulus of at most 5,000,000 psi is preferred and having a flexural modulus of at most 3,000,000 psi is more preferred and having a flexural modulus of at most 2,000,000 psi is even more preferred for the continuous phase of synthetic polymer in the finishing element. An organic synthetic polymer having a flexural modulus of from 5,000,000 to 50,000 psi is preferred and having a flexural modulus of from 3,000,000 to 100,000 psi is more preferred and having a flexural modulus of at from 2,000,000 to 200,000 psi is even more preferred for the continuous phase of synthetic polymer in the finishing element. For some less demanding applications (such as die with a lower pattern density), a flexural modulus of at least 20,000 psi is preferred. These ranges of flexural modulus for the synthetic polymers provide useful performance for finishing a semiconductor wafer and can improve local planarity in the semiconductor. Flexural modulus is preferably measured with ASTM 790 B at 73 degrees Fahrenheit. Pounds per square inch is psi.

An abrasive finishing element having Young's modulus in particular ranges is also preferred. An abrasive finishing element having a high Young's modulus is generally more efficient for planarizing. An abrasive finishing element having a low Young's modulus is generally more efficient for polishing. Further a continuous belt fixed abrasive finishing element can have a different optimum Young's modulus than a fixed abrasive finishing element disk. One also needs to consider the workpiece surface to be finished in selecting the Young's modulus. For a flexible abrasive finishing element having a Young's modulus from 100 to 700,000 psi (pounds per square in inch) is preferred and having a Young's modulus from 300 to 200,000 psi (pounds per square in inch) is more preferred and having a Young's modulus from 300 to 150,000 psi (pounds per square in inch) is even more preferred. Particularly stiff abrasive finishing elements can have a preferred Young's modulus of at least 700,000 psi. For particularly flexible abrasive finishing elements, a Young's modulus of less than 100,000 psi are preferred and less than 50,000 psi is more preferred.

An abrasive finishing element having abrasive asperities on the finishing element finishing surface is preferred. An abrasive finishing element having abrasive asperities having a height from 0.9 to 0.005 micrometers is preferred and an abrasive finishing element having abrasive asperities having a height from 0.3 to 0.005 micrometers is more preferred and an abrasive finishing element having abrasive asperities having a height from 0.1 to 0.01 micrometers is even more preferred and an abrasive finishing element having abrasive asperities having a height from 0.05 to 0.005 micrometers is more particularly preferred. the asperities are preferably firmly attached to the finishing element finishing surface and asperities which are an integral part of the finishing element finishing surface are more preferred. An abrasive finishing element having small asperities can finish a workpiece surface to fine tolerances.

Illustrative nonlimiting abrasive particles comprising silica, silicon nitride, alumina, and ceria are preferred. Fumed silica is particularly preferred. A metal oxide is a type of preferred abrasive particle. A particularly preferred particulate abrasive is an abrasive selected from the group consisting of iron (III) oxide, iron (II) oxide, magnesium oxide, barium carbonate, calcium carbonate, manganese dioxide, silicon dioxide, cerium dioxide, cerium oxide, chromium (III) trioxide, and aluminum trioxide. Abrasive particles having an average diameter of less than 0.5 micrometers are preferred and less than 0.3 micrometer are more preferred and less than 0.1 micrometer are even more preferred and less than 0.05 micrometers are even more particularly preferred. Abrasive particles having an average diameter of from 0.5 to 0.01 micrometer are preferred and between 0.3 to 0.01 micrometer are more preferred and between 0.1 to 0.01 micrometer are even more preferred.

Abrasive particles having a different composition from the finishing element body are preferred. An abrasive particle having a Knoop hardness of less than diamond is particularly preferred to reduce microscratches on workpiece surface being finished and a Knoop hardness of less than 50 GPa is more particularly preferred and a Knoop hardness of less than 40 GPa is even more particularly preferred and a Knoop hardness of less than 35 GPa is especially particularly preferred. An abrasive particle having a Knoop hardness of at least 1.5 GPa is preferred and having a Knoop hardness of at least 2 is preferred. An abrasive particle having a Knoop hardness of from 1.5 to 50 GPa is preferred and having a Knoop hardness of from 2 to 40 GPa is preferred and having a Knoop hardness of from 2 to 30 GPa is even more preferred. A fixed abrasive finishing element having a plurality of abrasive particles having at least two different Knoop hardnesses can be preferred.

A reinforcing layer or member can also be included with or attached to finishing element finishing body. A finishing element having a finishing body connected to a reinforcing layer is preferred and a finishing element having a finishing body integral with a reinforcing layer is more preferred. Preferred nonlimiting examples of reinforcing layers or members are fabrics, woven fabrics, film layers, and long fiber reinforcement members. A continuous belt can have substantially continuous fibers therein. Aramid fibers are particularly preferred for their low stretch and excellent strength. The reinforcing layers can attached with illustrative generally known adhesives and various generally known thermal processes such as extrusion coating or bonding.

The fixed abrasive firmly attached to the finishing element finishing surface is preferred. The abrasive can be firmly attached to the finishing element finishing surface with known adhesives and/or mixed into a surface layer of a polymeric layer, preferably an organic polymeric layer. Particular abrasive surface topographies can be preferred for specific applications. Fixed abrasive finishing elements are generally known to those skilled in the art. Some nonlimiting examples include U.S. Pat. No. 4,966,245 to Callinan, U.S. Pat. No. 5,823,855 to Robinson, U.S. Pat. No. 5,692,950 to Rutherford, WO 98/06541 to Rutherford and WO 98/181159 to Hudson are included herein for general guidance and modification of fixed abrasive finishing elements by those skilled in the art.

Figure 5A:
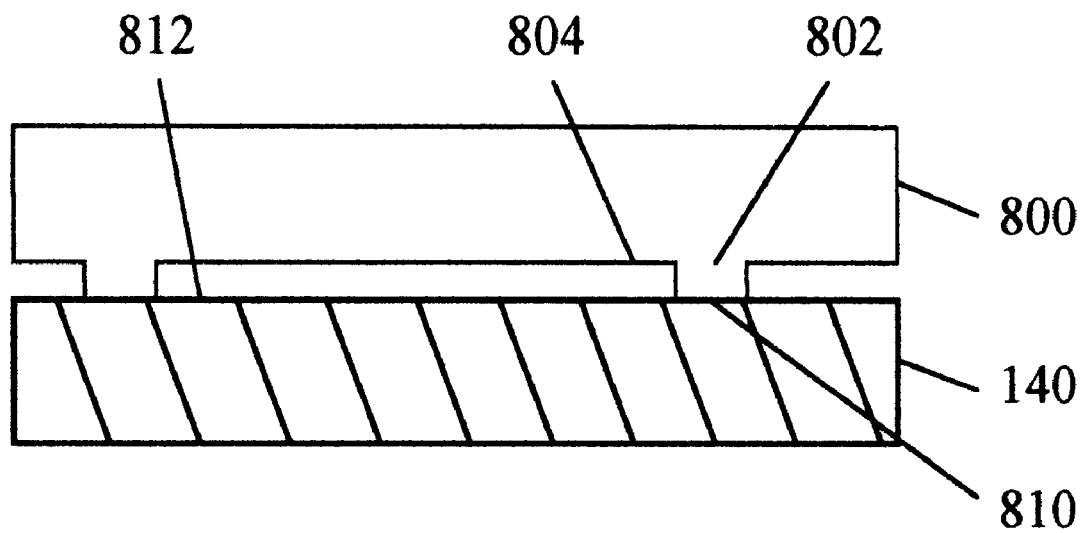
FIG. 5 is an artist's representation of finishing some unwanted raised regions and some regions below the unwanted raised regions with differential boundary lubrication.
Figure 5B:
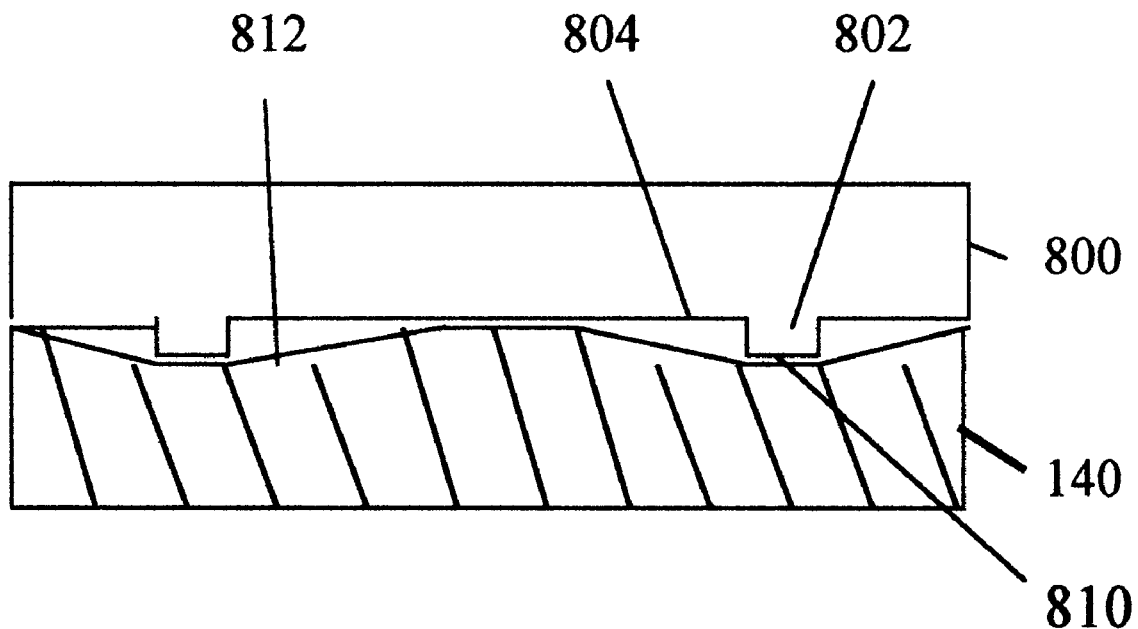

FIG. 5 is an artist's representation of finishing some unwanted raised regions and some regions below the unwanted raised regions. Reference Numeral 800 represents a portion of a semiconductor wafer surface having two unwanted raised regions. Reference Numeral 802 represent unwanted raised regions on the semiconductor surface being finished. Reference Numeral 804 represent lower local regions on the semiconductor surface being finished proximate to the unwanted raised regions. Reference Numeral 810 represents the finishing element finishing surface in local contact with the unwanted raised regions (Reference Numeral 802). Reference Numeral 812 represents the finishing element surface local region displaced from but proximate to and lower than the unwanted raised local regions. As shown the finishing element finishing surface can reduce pressure and/or lose actual contact with the lower local regions on the semiconductor proximate to the unwanted raised local regions. This leads to unwanted raised regions having higher pressure which in turn can reduce the lubricating boundary layer thickness in the unwanted raised regions. Reducing the boundary layer thickness generally increases local tangential friction forces, raises the finishing rate measured in angstroms per minute on the unwanted raised regions. Also the pressure in lower regions proximate the unwanted raised regions have lower pressure applied which in turn can increase lubricating boundary layer thickness in these lower regions. Increasing the lubricating boundary layer thickness generally decreases local tangential forces lowering the finishing rate measured in angstroms per minute in these lower regions proximate the unwanted raised regions. By increasing finishing rate in the unwanted raised regions and lowering the finishing rate in the proximate lower regions the planarity of the semiconductor is generally improved. This generally helps the unwanted raised regions to have higher finishing rates when measured in angstroms per minute and improves within die nonuniformity. As shown in the FIG. 5, the region of contact with the unwanted raised region is small which in turn raises the finishing pressure applied by the finishing elements having a higher flexural modulus and this increased pressure increases the finishing rate measured in angstroms per minute at the unwanted raised region. This higher pressure on the unwanted raised region also increases frictional heat which can further increase finishing rate measured in angstroms per minute in the unwanted raised region. Boundary lubrication on the unwanted raised region can be reduced due to the higher temperature and/or pressure which further increases friction and finishing rate measured in angstroms per minute. Higher stiffness finishing element finishing surfaces apply higher pressures to the unwanted raised local regions which can further improve planarization, finishing rates, and within die nonuniformity. Finishing using finishing elements of this in invention wherein the unwanted raised regions have a finishing rate measured in angstroms per minute of at least 1.6 times faster than in the proximate low local region measured in angstroms per minute is preferred and wherein the unwanted raised regions have a finishing rate of at least 2 times faster than in the proximate low local region is more preferred and wherein the unwanted raised regions have a finishing rate of at least 4 times faster than in the proximate low local region is even more preferred. Where there is no contact with the proximate low local region, the finishing rate in the low local region can be very small and thus the ratio between the finishing rate in the unwanted raised region to finishing rate in the low local region can be large. Using boundary lubrication control methods of this in invention wherein the unwanted raised regions have a finishing rate measured in angstroms per minute of from 1.6 to 500 times faster than in the proximate low local region measured in angstroms per minute is preferred and wherein the unwanted raised regions have a finishing rate of from 2 to 300 times faster than in the proximate low local region is more preferred and wherein the unwanted raised regions have a finishing rate of from 2 to 200 times faster than in the proximate low local region is even more preferred and wherein the unwanted raised regions have a finishing rate of from 4 to 200 times faster than in the proximate low local region is even more preferred. By increasing the stiffness of the finishing element finishing surface, the pressure applied to the unwanted raised region can be increased. Flexural modulus as measured by ASTM 790 B at 73 degrees Fahrenheit is a useful guide to help raise the stiffness of a polymer finishing element. By adjusting the flexural modulus as measured by ASTM 790 B at 73 degrees Fahrenheit the pressure can be increased on the unwanted raised regions to increase finishing rates measured in Angstroms per minute. Applying at least two times higher pressure to the unwanted raised region when compared to the applied pressure in a lower region proximate unwanted raised region is preferred and applying at least three times higher pressure to the unwanted raised region when compared to the applied pressure in a lower region proximate unwanted raised region is more preferred and applying five times higher pressure to the unwanted raised region when compared to the applied pressure in a lower region proximate unwanted raised region is even more preferred. Because the lower region proximate the unwanted raised region can have a very low pressure, at most 100 times higher pressure in the unwanted raised regions compared to the pressure in a lower region proximate the unwanted raised region is preferred and at most 50 times higher pressure in the unwanted raised regions compared to the pressure in a lower region proximate the unwanted raised region is more preferred. By adjusting the flexural modulus of the finishing element finishing surface, lubricating boundary layer, and the other control parameters discussed herein, finishing and planarization of semiconductor wafer surfaces can be accomplished. The lubricating boundary layer will now be illustrated in FIG. 6.

Figure 6:
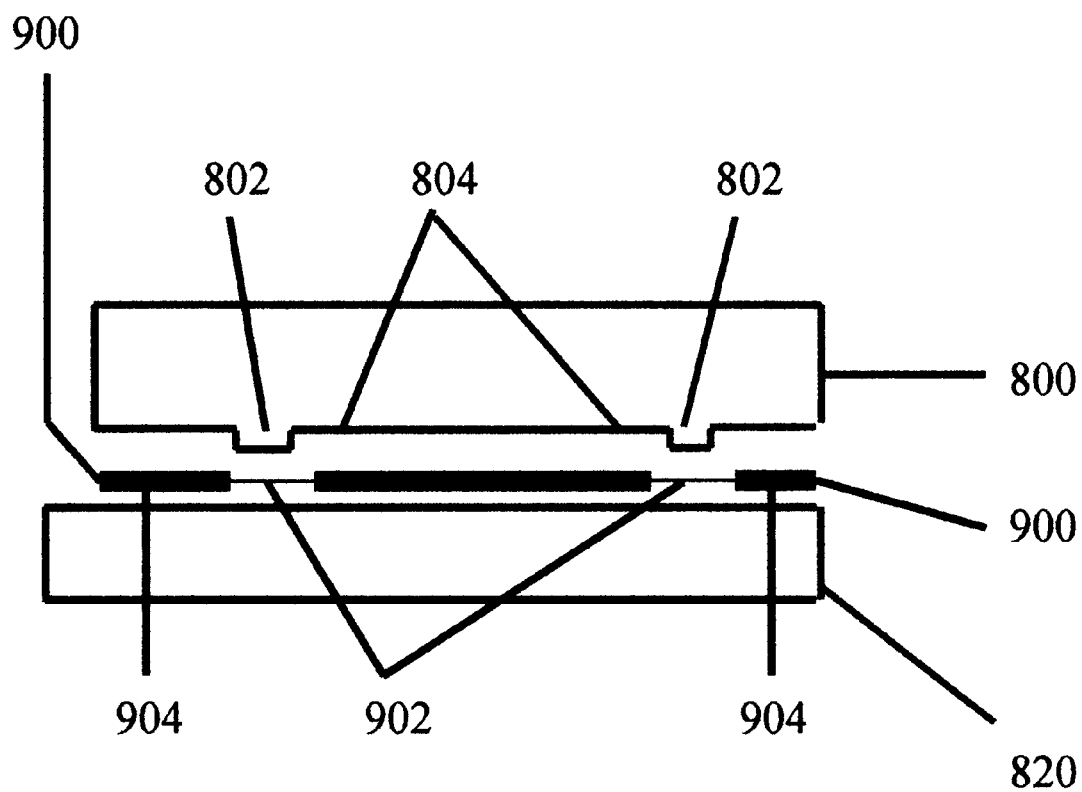
FIG. 6 is an artist's representation of an example of the effects on the boundary layer lubrication.

FIG. 6 is an artist's representation of an example of the effects on the boundary layer lubrication discussed herein above. As discussed herein, it is not drawn to scale so the boundary layer thickness can be illustrated in simple fashion for helpful guidance. Reference Numeral 800 represents a cross-sectional view of a semiconductor wafer having two unwanted raised regions (Reference Numeral 802). Reference Numeral 804 represents a cross-sectional view of a semiconductor wafer having lower regions proximate to the two unwanted raised regions (Reference Numeral 802). Reference Numeral 900 represents the lubricating boundary layer. Reference Numeral 902 represents thinner regions of lubricating boundary layer (for instance having a thickness of 4 molecules). Note that the thinner regions of a lubricating boundary layer can occur proximate the unwanted raised regions on the semiconductor wafer surface being finished. Reference Numeral 904 represents a thicker region of lubricating boundary layer which can generally occur in regions proximate to and below the unwanted raised regions. Reference Numeral 820 represents a small cross-section of finishing element. The different local regions having different lubricating boundary layers and lubricating properties is referred to herein as differential boundary lubrication. Differential lubricating boundary layers can improve planarization for some semiconductor wafers (particularly at the die level).

Finishing aid

Supplying an effective amount of finishing aid from the finishing element finishing surface layer, more preferably a lubricating aid, which reduces the coefficient of friction between the finishing element finishing surface and the workpiece surface being finished is preferred. Supplying an effective amount of finishing aid from the finishing element finishing surface layer, more preferably a lubricating aid, which reduces the unwanted surface damage to the surface of the workpiece being finished during finishing is preferred. Supplying an effective amount of finishing aid from the finishing element finishing surface layer, more preferably a lubricating aid, which differentially lubricates different regions of the work piece and reduces the unwanted surface damage to at least a portion of the surface of the workpiece being finished during finishing is preferred.

The finishing aid, more preferably a lubricating aid, can help reduce the formation of surface defects for high precision part finishing. Fluid based finishing aid, more preferably a lubricating aid, can help reduction of brittle fracture at the workpiece surface being finished. A method of finishing which adds an effective amount of fluid based finishing aid, more preferably a lubricating aid, to the interface between the finishing element finishing surface and workpiece surface being finished is preferred. A preferred effective amount of fluid based finishing aid, more preferably a lubricating aid, reduces the occurrence of unwanted surface defects. A preferred effective amount of fluid based finishing aid, more preferably a lubricating aid, can reduce the coefficient of friction between the work piece surface being finished and the finishing element finishing surface.

A lubricating aid which is water soluble is preferred. A lubricating aid which has a different solubility in water at different temperatures is more preferred. A degradable finishing aid, more preferably a lubricating aid, is also preferred and a biodegradable finishing aid, more preferably a lubricating aid, is even more preferred. An environmentally friendly finishing aid, more preferably a lubricating aid, is particularly preferred. A water based lubricant formed with water which has low sodium content is also preferred because sodium can have a adverse performance effect on the preferred semiconductor parts being made. A lubricant free of sodium is a preferred lubricant. As used herein a lubricant fluid free of sodium means that the sodium content is below the threshold value of sodium which will adversely impact the performance of a semiconductor wafer or semiconductor parts made therefrom. A finishing aid, more preferably a lubricating aid, free of sodium is preferred. As used herein a finishing aid free of sodium means that the sodium content is below the threshold value of sodium which will adversely impact the performance of a semiconductor wafer or semiconductor parts made therewith.

Certain particularly important workpieces in the semiconductor industry have regions of high conductivity and regions of low conductivity. The higher conductivity regions are often comprised of metallic materials such as tungsten, copper, aluminum, and the like. An illustrative example of a common lower conductivity region is silicon and silicon oxide. A fluid based lubrication which differentially lubricates the two regions is preferred and a fluid based lubricant which substantially differentially lubricates two regions is more preferred. An example of a differential lubrication is if the coefficient of friction is changed by different amounts in one region versus the other region during finishing. An example of differential lubrication is where the boundary lubricant reacts differently with different chemical compositions to create regions having different local regions of tangential friction force and different coefficients of friction. Another example is where the semiconductor surface being finished topography (for instance unwanted raised regions) interact within the operative finishing interface to create local regions having different tangential friction forces and different coefficients of friction (see for example FIG. 5 discussion herein). For instance one region (or area) can have the coefficient of friction reduced by 20% and the other region (or area) reduced by 40%. This differential change in lubrication can be used to help in differential finishing of the two regions. An example of differential finishing is a differential finishing rate between the two regions. For example, a first region can have a finishing rate of "X" angstroms/minute and a second region can have a finishing rate of "Y" angstroms per minute before lubrication and after differential lubrication, the first region can have a finishing rate of 80% of "X" and the second region can have a finishing rate of 60% of "Y". An example of where this will occur is when the lubricant tends to adhere to one region because of physical or chemical surface interactions (such as a metallic conductive region) and not adhere or not adhere as tightly to the an other region (such as a non metallic, non conductive region). Different regions can have different lubricating boundary layer thicknesses. Changing the finishing control parameters to change the differential lubrication during finishing of the workpiece is a preferred method of finishing. Changing the finishing control parameters to change the differential lubrication during finishing of the workpiece which in turn changes the region finishing rates in the workpiece is a more preferred method of finishing. Changing the finishing control parameters with in situ process control to change the differential lubrication during finishing of the workpiece which in turn changes the region finishing rates in the workpiece is an even more preferred method of finishing. A secondary friction sensor probe can aid in an important way in detecting and controlling differential lubrication in the workpieces having heterogeneous surface compositions needing finishing.

A lubricating aid comprising a reactive lubricant is preferred. A lubricating aid comprising a boundary lubricant is also preferred. A reactive lubricant is a lubricant which chemically reacts with the workpiece surface being finished. A boundary layer lubricant is a preferred example of a lubricant which can form a lubricating film on the surface of the workpiece surface. As used herein a boundary lubricant is a thin layer on one or more surfaces which prevents or at least limits, the formation of strong adhesive forces between the workpiece being finished and the finishing element finishing surface and therefore limiting potentially damaging friction junctions between the workpiece surface being finished and the finishing element finishing surface. A boundary layer film has a comparatively low shear strength in tangential loading which reduces the tangential force of friction between the workpiece being finished and the finishing element finishing surface which can reduce surface damage to the workpiece being finished. In other words, boundary lubrication is a lubrication in which friction between two surfaces in relative motion, such as the workpiece surface being finished and the finishing element finishing surface, is determined by the properties of the surfaces, and by the properties of the lubricant other than the viscosity. Organic lubrication layers wherein the friction between two surfaces is dependent on lubricant properties other than viscosity is preferred. Different regional boundary layers on a semiconductor wafer surface being finished can be preferred for some finishing—particularly planarizing. A boundary film generally forms a thin film, perhaps even several molecules thick, and the boundary film formation depends on the physical and chemical interactions with the surface. A boundary lubricant which forms of thin film is preferred. A boundary lubricant forming a film having a thickness from 1 to 10 molecules thick is preferred and a boundary lubricant forming a film having a thickness from 1 to 6 molecules thick is more preferred and a boundary lubricant forming a film having a thickness from 1 to 4 molecules thick is even more preferred. A boundary lubricant forming a film having a thickness from 1 to 10 molecules thick on at least a portion of the workpiece surface being finished is particularly preferred and a boundary lubricant forming a film having a thickness from 1 to 6 molecules thick on at least a portion of the workpiece surface being finished is more particularly preferred and a boundary lubricant forming a film having a thickness from 1 to 4 molecules thick on at least a portion of the workpiece surface being finished is even more particularly preferred. A boundary lubricant forming a film having a thickness of at most 10 molecules thick on at least a portion of the workpiece surface being finished is particularly preferred and a boundary lubricant forming a film having a thickness of at most 6 molecules thick on at least a portion of the workpiece surface being finished is more particularly preferred and a boundary lubricant forming a film having a thickness of at most 4 molecules thick on at least a portion of the workpiece surface being finished is even more particularly preferred. An operative motion which continues in a substantially uniform direction can improve boundary layer formation and lubrication. A discontinuous operative motion can be used to change the lubricating boundary layer. Boundary lubricants, because of the small amount of required lubricant, are particularly effective finishing aids for inclusion in fixed abrasive finishing elements. The molecular thickness of lubricating boundary layers can be measured with generally known frictional force measures and/or energy change sensors discussed herein. Changing the pressure in the operative finishing interface and/or in the secondary friction sensor interface can be used to determine molecular thickness. Controls can also be used by using various generally known analytical techniques such as spectroscopy and these results used to calibrate target energy change sensors and frictional force measures. Thermal analysis can also be used to measure the quantity of organic boundary layer on a surface and then the thickness calculated. Thermal analysis can be used to determine the efficacy of a particular lubricating boundary layer including solid boundary lubricant zone, boundary liquid lubricant zone, and boundary lubricant desorbed zone and the transition temperatures therebetween.

Heterogeneous lubricating boundary layers can improve finishing and planarizing of some semiconductor wafers where a differential finishing rate is desired in different regions. A semiconductor wafer surface having at least one unwanted raised region wherein the lubricating boundary layer thickness is at most one half the molecular layer thickness of the lubricating boundary layer thickness proximate to the unwanted raised region is preferred. A semiconductor wafer surface having at least one unwanted raised region wherein the boundary lubrication thickness is at most one third the molecular layer thickness of the lubricating boundary layer thickness proximate to the unwanted raised region is more preferred. A semiconductor wafer surface having at least one unwanted raised region wherein the lubricating boundary layer thickness is at most one quarter the molecular layer thickness of the lubricating boundary layer thickness proximate to the unwanted raised region is more preferred. Applications of this technology are further discussed herein elsewhere.

Controlling the thickness of the lubricating boundary layer by changing at least one control parameter in a manner that changes the tangential force of friction in at least one region of the semiconductor wafer surface in response to an in situ control signal is preferred. Controlling the thickness of the lubricating boundary layer by changing at least one control parameter in a manner that changes the tangential force of friction in at least two different regions of the semiconductor wafer surface in response to an in situ control signal is more preferred. Preferably the unwanted raised regions are related to a repeating pattern in the semiconductor wafer die. A plurality of die each having the same repeating pattern on the semiconductor wafer surface being finished is preferred. These repeating patterns are generally created during semiconductor wafer manufacture and can be related to pattern densities. This is because small changes in lubricating boundary layers can change finishing rate, finishing rate selectivity, and finished surface quality.

A reactive boundary lubricant is a preferred lubricant. A lubricating boundary layer comprising physical adsorption (physisorption) of the lubricant molecules to the semiconductor surface being finished is a preferred lubricating boundary layer. Van der Waals surface forces are a preferred example of physical adsorption. Dipole—dipole interaction between the boundary lubricant and the semiconductor wafer surface being finished is a preferred example of physical adsorption. A reversible dipole—dipole interaction between the boundary lubricant and the semiconductor wafer surface is an example of a more preferred physical adsorption lubricating boundary layer. An organic alcohol is an illustrative preferred example. A polar organic molecule containing the hetereoatom oxygen is preferred. An organic boundary lubricating layer which is a solid film generally has a greater ability to separate the finishing element finishing surface from the semiconductor wafer surface being finished. A heat of adsorption of from 2,000 to 10,000 cal/mole is preferred for physisorption. A physisorption organic boundary lubricating layer is a preferred reversible lubricating layer.

A lubricating boundary layer comprising chemisorption of lubricant molecules to the semiconductor wafer being finished is a preferred lubricating boundary layer. In chemisorption, chemical bonds hold the boundary lubricants to the semiconductor wafer surface being finished. As an illustrative example, a reaction of stearic acid forms a "metal soap" thin film on a metal surface. An organic carboxylic acid is a preferred example. Further, the "metal soap" can have a higher melting temperature and thus form regional areas of an organic boundary layer having higher temperature lubricating capacity as discussed further herein below. A heat of absorption of between 10,000 to 100,000 cal/mole is preferred for chemisorption.

A solid film organic boundary lubricating layer generally has a greater ability to separate the finishing element finishing surface from the semiconductor wafer surface being finished. A solid film organic boundary lubricating layer can thus help reduce finishing rates as measured in angstroms per minute (compared to a liquid film). A liquid film organic boundary lubricating layer generally has a lower ability to separate the finishing element finishing surface from the semiconductor wafer surface being finished can thus help increase finishing rates as measured in angstroms per minute (compared to a solid film). The same boundary lubricant can form either solid film organic boundary lubricating layer or a liquid film organic boundary lubricating layer depending on the operative finishing interface process conditions. A reversible organic boundary lubricating layer (which can change from solid to liquid to solid depending on processing conditions such as temperature) is preferred. Finishing a heterogeneous semiconductor wafer surface having at least one unwanted raised region wherein the lubricating boundary layer comprises a liquid film on the unwanted raised region and the lubricating boundary layer comprises a solid film in the region below and proximate to the unwanted raised region is preferred. Finishing a heterogeneous semiconductor wafer surface having at least one unwanted raised region wherein the lubricating boundary layer comprises a higher temperature liquid film on the unwanted raised region and the lubricating boundary layer comprises a lower temperature solid film in the region below and proximate to the unwanted raised region is preferred. Applying an operative finishing motion to the operative finishing interface forming a heterogeneous temperature profile on the semiconductor wafer surface being finishing and wherein the temperature is higher on a plurality of unwanted raised regions of the heterogeneous semiconductor wafer surface and the temperature is lower proximate to and below the plurality of unwanted raised regions of the heterogeneous semiconductor wafer surface and further the plurality of unwanted raised regions have a liquid lubricating films on them and the regions proximate to and below the plurality of unwanted raised regions solid lubricating films on them. See for instance Reference Numerals 802 (unwanted raised region) and 804 (region proximate to and below the unwanted raised region) for further helpful guidance. An example is octadecyl alcolhol forms a solid lubricant film on copper at about 20 to 55 degrees centigrade and a liquid film on copper at about 65 to 110 degrees centigrade. An organic boundary lubricating layer that is capable of changing from a solid film to a liquid film in the operative finishing interface temperature range during a finishing cycle time is preferred. An organic boundary lubricating layer that is capable of changing from a solid film to a different physical form in the operative finishing interface temperature range during a finishing cycle time is preferred. An organic boundary lubricating layer that is capable of changing from a liquid film to a different physical form in the operative finishing interface temperature range during a finishing cycle time is preferred. An organic boundary lubricating layer that is capable of changing from a solid film to a liquid film in the temperature range from 20 to 100 degrees centigrade is more preferred. By increasing the finishing rate in the unwanted raised region and lowering the finishing rate in the region proximate to and below the unwanted raised region, planarization can be improved. Changing the lubricating boundary layer film physical form by changing at least one lubrication control parameter in situ based on feed back information from a lubrication control subsystem having an energy change sensor is preferred. Controlling the lubricating boundary layer film physical form by changing at least one lubrication control parameter in situ based on feed back information from a lubrication control subsystem having an energy change sensor is more preferred. Increasing temperature on the unwanted raised region on the semiconductor wafer surface compared to the temperature on the region below the unwanted raised region forming the lubricating boundary layer liquid film on the unwanted raised region and the lubricating boundary layer solid film on at least a portion of the semiconductor wafer surface below the raised region is preferred. Increasing temperature with frictional heat on the unwanted raised region on the semiconductor wafer surface compared to the temperature on the region below the unwanted raised region forming the lubricating boundary layer liquid film on the unwanted raised region and the lubricating boundary layer solid film on at least a portion of the semiconductor wafer surface below the raised region is more preferred. Using and controlling the lubricating boundary layer physical form can help customize finishing for the particular semiconductor wafers needing finishing. The operative motion interacts with the lubricating boundary layer in a new and useful way to finish a workpiece surface, preferably a semiconductor wafer surface.

A boundary lubricant which forms a thin lubricant film on the metal conductor portion of a workpiece surface being finished is particularly preferred. A nonlimiting preferred group of example boundary lubricants include at least one lubricant selected from the group consisting of fats, fatty acids, esters, and soaps. A preferred group of boundary lubricants comprise organic boundary lubricants. Another preferred group of boundary lubricants comprise organic synthetic lubricants. A phosphorous containing compound can be an effective preferred boundary lubricant. A phosphate ester is an example of a preferred phosphorous containing compound which can be an effective boundary lubricant. A chlorine containing compound can be an effective preferred boundary lubricant. A sulfur containing compound can be an effective preferred boundary lubricant. A compound containing atoms selected from the group consisting of one or more of the following elements oxygen, fluorine, or chlorine can be an effective finishing aid. A synthetic organic polymer containing atoms selected from the group consisting of one or more of the following elements oxygen, fluorine, or chlorine can be an effective finishing aid. A sulfated vegetable oil and sulfurized fatty acid soaps are preferred examples of a sulfur containing compound. A lubricant which reacts physically with at least a portion of the workpiece surface being finished is a preferred lubricant. A lubricant which reacts chemically with at least a portion of the workpiece surface being finished is often a more preferred lubricant because it is often a more effective lubricant and can also aid at times directly in the finishing.

A marginally effective lubricant between the workpiece being finished and the finishing element finishing surface is preferred. As used herein, a marginally effective lubricant is a lubricant and amount which does not perfectly lubricant and stop all wear but allows some wear while reducing or eliminating especially deleterious wear.

Limited zone lubrication between the workpiece being finished and the finishing element finishing surface is preferred. As used herein, limited zone lubricating is lubricating to reduce friction between two surfaces while simultaneously having wear occur. Limited zone lubricating which simultaneously reduces friction between the operative finishing interface while maintaining a cut rate on the workpiece surface being finished is preferred. Limited zone lubricating which simultaneously reduces friction between the operative finishing interface while maintaining an acceptable cut rate on the workpiece surface being finished is more preferred. Limited zone lubricating which simultaneously reduces friction between the operative finishing interface while maintaining a finishing rate on the workpiece surface being finished is preferred. Limited zone lubricating which simultaneously reduces friction between the operative finishing interface while maintaining an acceptable finishing rate on the workpiece surface being finished is more preferred. Limited zone lubricating which simultaneously reduces friction between the operative finishing interface while maintaining a planarizing rate on the workpiece surface being finished is preferred. Limited zone lubricating which simultaneously reduces friction between the operative finishing interface while maintaining an acceptable planarizing rate on the workpiece surface being finished is more preferred. Limited zone lubricating which simultaneously reduces friction between the operative finishing interface while maintaining a polishing rate on the workpiece surface being finished is preferred. Limited zone lubricating which simultaneously reduces friction between the operative finishing interface while maintaining an acceptable polishing rate on the workpiece surface being finished is preferred. Lubricant types and concentrations are preferably controlled during limited zone lubricating. Limited zone lubricating offers the advantages of controlled wear along with reduced unwanted surface damage.

Limited zone lubrication between the workpiece being finished and the finishing element finishing surface is preferred. As used herein, limited zone lubricating is lubricating to reduce friction between two surfaces while simultaneously having wear occur. Limited zone lubricating which simultaneously reduces friction between the operative finishing interface while maintaining a cut rate on the workpiece surface being finished is preferred. Limited zone lubricating which simultaneously reduces friction between the operative finishing interface while maintaining an acceptable cut rate on the workpiece surface being finished is more preferred. Limited zone lubricating which simultaneously reduces friction between the operative finishing interface while maintaining a finishing rate on the workpiece surface being finished is preferred. Limited zone lubricating which simultaneously reduces friction between the operative finishing interface while maintaining an acceptable finishing rate on the workpiece surface being finished is more preferred. Limited zone lubricating which simultaneously reduces friction between the operative finishing interface while maintaining a planarizing rate on the workpiece surface being finished is preferred. Limited zone lubricating which simultaneously reduces friction between the operative finishing interface while maintaining an acceptable planarizing rate on the workpiece surface being finished is more preferred. Limited zone lubricating which simultaneously reduces friction between the operative finishing interface while maintaining a polishing rate on the workpiece surface being finished is preferred. Limited zone lubricating which simultaneously reduces friction between the operative finishing interface while maintaining an acceptable polishing rate on the workpiece surface being finished is preferred. Lubricant types and concentrations are preferably controlled during limited zone lubricating. Limited zone lubricating offers the advantages of controlled wear along with reduced unwanted surface damage.

Lubricants which are polymeric can be very effective lubricants. A boundary lubricant comprising organic synthetic polymers are preferred lubricants. Supplying a lubricant to the interface of the workpiece surface being finished and the finishing element finishing surface wherein the lubricant is from 0.1 to 15% by weight of the total fluid between the interface is preferred and from 0.2 to 12% by weight of the total fluid between the interface is more preferred and from 0.3 to 12% by weight of the total fluid between the interface is even more preferred and from 0.3 to 9% by weight of the total fluid between the interface is even more particularly preferred. These preferred ranges are given for general guidance and help to those skilled in the art. Lubricants outside this range are currently believed to be useful but not as economical to use.

A lubricant having a molecular weight of at least 250 is often preferred. A lubricant having functional groups containing elements selected from the group consisting of chlorine, sulfur, and phosphorous is preferred and a boundary lubricant having functional groups containing elements selected from the group consisting of chlorine, sulfur, and phosphorous is more preferred. A lubricant comprising a fatty acid substance is a preferred lubricant. An preferred example of a fatty substance is a fatty acid ester or salt. Fatty acid salts of plant origin can be particularly preferred. A lubricant comprising a synthetic polymer is preferred and a lubricant comprising a boundary lubricant synthetic polymer is more preferred and a lubricant comprising a boundary lubricant synthetic polymer and wherein the synthetic polymer is water soluble is even more preferred. A polymer having a number average molecular weight from 400 to 150,000 is preferred and having a number average molecular weight from 1,000 to 100,000 is more preferred and having a number average molecular weight from 1,000 to 50,000 is even more preferred.

A lubricant comprising a polyalkylene glycol polymer is a preferred composition. A polymer of polyoxyalkylene glycol monoacrylate or polyoxyalkylene glycol monomethacrylate is very useful as a base of lubricant. A polyethylene glycol having a molecular weight of 200 to 2000 is preferred. Polyglycol having a molecular weight of at least 600 is preferred and a polgylcol having a molecular weight above 800 is more preferred. Polyglycols selected from the group polymers consisting of ethylene oxide, propylene oxide, and butylene oxide and mixtures thereof are particularly preferred. A fatty acid ester can be an effective lubricant. Polyglycol derivatives are also preferred. An amine modified polyglycol is an example of a preferred polyglycol.

A preferred finishing aid is a lubricating aid which can be included in the finishing element. A finishing aid distributed in at least a portion of the finishing element proximate the finishing element finishing surface is preferred and a finishing aid distributed substantially uniformly in at least a portion of the finishing element proximate the finishing element finishing surface is more preferred and a finishing aid distributed uniformly in at least a portion of the finishing element proximate the finishing element finishing surface is even more preferred. A finishing aid selected from the group consisting of liquid and solid lubricants and mixtures thereof is a preferred finishing aid.

A combination of a liquid lubricant and ethylene vinyl acetate, particularly ethylene vinyl acetate with 15 to 50% vinyl acetate by weight, can be a preferred effective lubricating aid additive. Preferred liquid lubricants include paraffin of the type which are solid at normal room temperature and which become liquid during the production of the finishing element. Typical examples of desirable liquid lubricants include paraffin, naphthene, and aromatic type oils, e.g. mono- and polyalcohol esters of organic and inorganic acids such as monobasic fatty acids, dibasic fatty acids, phthalic acid and phosphoric acid.

The lubricating aid can be contained in finishing element body in different preferred forms. A lubricating aid dispersed in an organic synthetic polymer is preferred. A lubricating aid which is a liquid lubricant can be dispersed throughout the primary organic synthetic resin wherein the liquid lubricant effect of the binding of the fixed abrasive is carefully controlled. A fixed abrasive free a coating having finishing aids is preferred and fixed abrasive particles free of a coating having finishing aid is more preferred. A lubricating aid dispersed in a minor amount of organic synthetic polymer which is itself dispersed in the primary organic synthetic polymer in discrete, unconnected regions is more preferred. As an illustrative example, a lubricant dispersed in a minor amount of an ethylene vinyl acetate and wherein the ethylene vinyl acetate is dispersed in discrete, unconnected regions in a polyacetal resin. A lubricating aid dispersed in discrete, unconnected regions in an organic synthetic polymer is preferred. By dispersing the finishing aid and/or lubricating aids in a plurality of discrete, unconnected regions, their impact on the binding of the fixed abrasive in the body of the fixed abrasive element is reduced or eliminated.

A polyglycol is an example of a preferred finishing aid. Preferred polyglycols include glycols selected from the group consisting of polyethylene glycol, an ethylene oxide-propylene butyl ethers, a diethylene glycol butyl ethers, ethylene oxide-propylene oxide polyglycol, a propylene glycol butyl ether, and polyol esters. A mixture of polyglycols is a preferred finishing aid. Alkoxy ethers of polyalkyl glycols are preferred finishing aids. An ultra high molecular weight polyethylene, particularly in particulate form, is an example of preferred finishing aid. A fluorocarbon resin is an example of a preferred lubricating agent. Fluorocarbons selected from the group consisting of polytetrafluoroethylene (PTFE), ethylene tetrafluoride/propylene hexafluoride copolymer resin (FEP), an ethylene tetrafluoride/perfluoroalkoxyethylene copolymer resin (PFA), an ethylene tetra fluoride/ethylene copolymer resin, a trifluorochloroethylene copolymer resin (PCTFE), and a vinylidene fluoride resin are examples of preferred fluorocarbon resin finishing aids. A polyphenylene sulfide polymer is a preferred polymeric lubricating aid. Polytetrafluoroethylene is a preferred finishing aid. Polytetrafluoroethylene in particulate form is a more preferred finishing aid and polytetrafluoroethylene in particulate form which resists reaggolmeration is a even more preferred finishing aid. A silicone oil is a preferred finishing aid. A polypropylene is a preferred finishing aid, particularly when blended with polyamide and more preferably a nylon 66. A lubricating oil is a preferred finishing aid. A polyolefin polymer can be a preferred effective lubricating aid, particularly when incorporated into polyamide resins and elastomers. A high density polyethylene polymer is a preferred polyolefin resin. A polyolefin/polytetrafluoroethylene blend is also a preferred lubricating aid. Low density polyethylene can be a preferred lubricating aid. A fatty acid substance can be a preferred lubricating aid. An examples of a preferred fatty acid substance is a fatty ester derived from a fatty acid and a polyhydric alcohol. Examples fatty acids used to make the fatty ester are lauric acid, tridecylic acid, myristic acid, pentadecylic acid, palmitic acid, margaric acid, stearic acid, nonadecylic acid, arachidic acid, oleic acid, elaidic acid and other related naturally occurring fatty acids and mixtures thereof. Examples of preferred polyhydric alcohols include ethylene glycol, propylene glycol, homopolymers of ethylene glycol and propylene glycol or polymers and copolymers thereof and mixtures thereof.

Illustrative, nonlimiting examples of finishing aids include organic synthetic resin systems and general useful related technology are given in the U.S. Pat. Nos. 3,287,288 to Reilling, 3,458,596 to Eaigle, 4,877,813 to Jimo et. al., 5,079,287 to Takeshi et. al., 5,110,685 to Cross et. al., 5,216,079 to Crosby et. al., 5,523,352 to Janssen, and 5,591,808 to Jamison and are included herein by reference in their entirety for guidance and modification as appropriate by those skilled in the art. Some preferred suppliers of lubricants include Dow Chemical, Huntsman Corporation, and Chevron Corporation.

Generally those skilled in the art know how to measure the kinetic coefficient of friction. A preferred method is ASTM D 3028 - 95 and ASTM D 3028-95 B is particularly preferred. Those skilled in the art can modify ASTM D 3028-95 B to adjust to appropriate finishing velocities and to properly take into consideration appropriate fluid effects due to the lubricant and finishing composition. Preferred lubricants and finishing compositions do not corrode the workpiece or localized regions of the workpiece. Corrosion can lead to workpiece failure even before the part is in service. ASTM D 130 is a is a useful test for screening lubricants for particular workpieces and workpiece compositions. As an example of a metal strip such as a copper strip is cleaned and polished so that no discoloration or blemishes detectable. The finishing composition to be tested is then added to a test tube, the copper strip is immersed in the finishing composition and the test tube is then closed with a vented stopper. The test tube is then heated under controlled conditions for a set period of time, the metal strip is removed, the finishing composition removed, and the metal strip is compared to standards processed under identical conditions to judge the corrosive nature and acceptableness of the finishing composition. ASTM D 1748 can also be used to screen for corrosion. Alternately a solid lubricant can be deposited on a surface to be screened for corrosive effects and the target sample tested under appropriate conditions. These test methods are included herein by reference in their entirety.

Supplying an effective marginal lubrication to the interface between the workpiece surface being finished and the finishing element finishing surface is preferred and supplying an effective marginal boundary lubrication to the interface between the workpiece surface being finished and the finishing element finishing surface is more preferred. Marginal lubrication is less than complete lubrication and facilitates controlling frictional wear and tribochemical reactions. Independent control of the lubricant control parameters aids in controlling an effective amount of marginal lubrication and in situ control of the lubricant control parameters is more preferred.

Stabilizing fillers

A fibrous filler is a preferred stabilizing filler for the finishing element finishing surface layer of this invention. A plurality of synthetic fibers are particularly preferred fibrous filler. Fibrous fillers tend to help generate a lower abrasion coefficient and/or stabilize the finishing element finishing surface from excessive wear. By reducing wear the finishing element has improved stability during finishing.

A preferred stabilizing filler is a dispersion of fibrous filler material dispersed in the finishing element body. An organic synthetic resin fibers are a preferred fibrous filler. Preferred fibrous fillers include fibers selected from the group consisting of aramid fibers, polyester fibers, and polyamide fibers. Preferably the fibers have a fiber diameter of from 1 to 15 microns and more preferably, from 1 to 8 microns. Preferably the fibers have a length of less than 1 cm and more preferably a length from 0.1 to 0.6 cm and even more preferably a length from 0.1 to 0.3 cm. Particularly preferred are short organic synthetic resin fibers that can be dispersed in the finishing element and more preferably mechanically dispersed in at least a portion of the finishing element proximate the finishing element finishing surface and more preferably, mechanically substantially uniformly dispersed in at least a portion of the finishing element proximate the finishing element finishing surface and even more preferably and even more preferably, mechanically substantially uniformly dispersed in at least a portion of the finishing element proximate the finishing element finishing surface. The short organic synthetic fibers are added in the form of short fibers substantially free of entanglement and dispersed in the finishing element matrix. Preferably, the short organic synthetic fibers comprise fibers of at most 0.6 cm long and more preferably 0.3 cm long. An aromatic polyamide fiber is particularly preferred. Aromatic polyamide fibers are available under the tradenames of "Kevlar" from DuPont in Wilmington, Del. and "Teijin Cornex" from Teijin Co. Ltd. The organic synthetic resin fibers can be dispersed in the synthetic by methods generally known to those skilled in the art. As a nonlimiting example, the cut fibers can be dispersed in a thermoplastic synthetic resin particles of under 20 mesh, dried, and then compounded in a twin screw, counter rotating extruder to form extruded pellets having a size of from 0.2–0.3 cm. Optionally, the pellets can be water cooled, as appropriate. These newly formed thermoplastic pellets having substantially uniform discrete, dispersed, and unconnected fibers can be used to extruded or injection mold a fixed abrasive element of this invention. Aramid powder can also be used to stabilize the finishing element organic synthetic polymers to wear. Organic synthetic resin fibers are preferred because they tend to reduce unwanted scratching to the workpiece surface.

U.S. Pat. Nos. 4,877,813 to Jimmo, 5,079,289 to Takeshi et. al., and 5,523,352 to Janssen are included herein by reference in its entirety for general guidance and appropriate modification by those skilled in the art.

Workpiece

A workpiece needing finishing is preferred. A homogeneous surface composition is a workpiece surface having one composition throughout and is preferred for some applications. A workpiece needing polishing is preferred. A workpiece needing planarizing is especially preferred. A workpiece having a microelectronic surface is preferred. A workpiece surface having a heterogeneous surface composition is preferred. A heterogeneous surface composition has different regions with different compositions on the surface, further the heterogeneous composition can change with the distance from the surface. Thus finishing can be used for a single workpiece whose surface composition changes as the finishing process progresses. A workpiece having a microelectronic surface having both conductive regions and nonconductive regions is more preferred and is an example of a preferred heterogeneous workpiece surface. Illustrative examples of conductive regions can be regions having copper or tungsten and other known conductors, especially metallic conductors. Metallic conductive regions in the workpiece surface consisting of metals selected from the group consisting of copper, aluminum, and tungsten or combinations thereof are particularly preferred. A semiconductor device is a preferred workpiece. A substrate wafer is a preferred workpiece. A semiconductor wafer having a polymeric layer requiring finishing is preferred because a lubricating aid can be particularly helpful in reducing unwanted surface damage to the softer polymeric surfaces. An example of a preferred polymer is a polyimide. Polyimide polymers are commercially available from E. I. DuPont Co. in Wilmington, Del. A semiconductor having a interlayer dielectric needing finishing is preferred.

This invention is particularly preferred for workpieces requiring a highly flat surface. Finishing a workpiece surface to a surface to meet the specified semiconductor industry circuit design rule is preferred and finishing a workpiece surface to a surface to meet the 0.35 micrometers feature size semiconductor design rule is more preferred and finishing a workpiece surface to a surface to meet the 0.25 micrometers feature size semiconductor design rule is even more preferred and finishing a workpiece surface to a to meet the 0.18 micrometers semiconductor design rule is even more particularly preferred. An electronic wafer finished to meet a required surface flatness of the wafer device rule in to be used in the manufacture of ULSIs (Ultra Large Scale Integrated Circuits) is a particularly preferred workpiece made with a method according to preferred embodiments of this invention. The design rules for semiconductors are generally known to those skilled in the art. Guidance can also be found in the "The National Technology Roadmap for Semiconductors" published by SEMATECH in Austin, Tex.

A semiconductor wafer having a diameter of at least 200 mm is preferred and a semiconductor wafer having a diameter of at least 300 mm is more preferred.

Finishing composition

Finishing compositions are generally known for fixed abrasive finishing. A chemical mechanical polishing slurry can also be used as finishing composition. Alternately, a finishing composition can be modified by those skilled in the art by removing the abrasive particles to form a finishing composition free of abrasive particles. A finishing composition substantially free of abrasive particles is preferred and a finishing composition free of abrasive particles is more preferred. Finishing compositions have their pH adjusted carefully, and generally comprise other chemical additives are used to effect chemical reactions and/other surface changes to the workpiece. A finishing composition having dissolved chemical additives is particularly preferred. Illustrative examples preferred dissolved chemical additives include dissolved acids, bases, buffers, oxidizing agents, reducing agents, stabilizers, and chemical reagents. A finishing composition having a chemical which substantially reacts with material from the workpiece surface being finished is particularly preferred. A finishing composition having a chemical which selectively chemically reacts with only a portion of the workpiece surface is particularly preferred. A finishing composition having a chemical which preferentially chemically reacts with only a portion of the workpiece surface is particularly preferred.

Some illustrative nonlimiting examples of polishing slurries which can be used and/or modified by those skilled in the art are now discussed. An example slurry comprises water, a solid abrasive material and a third component selected from the group consisting of $HNO_3$, $H_2SO_4$, and $AgNO_3$ or mixtures thereof. Another polishing slurry comprises water, aluminum oxide, and hydrogen peroxide mixed into a slurry. Other chemicals such as KOH (potassium hydroxide) can also be added to the above polishing slurry. Still another illustrative polishing slurry comprises $H_3PO_4$ at from about 0.1% to about 20% by volume, $H_2O_2$ at from 1% to about 30% by volume, water, and solid abrasive material. Still another polishing slurry comprises an oxidizing agent such as potassium ferricyanide, an abrasive such as silica, and has a pH of between 2 and 4. Still another polishing slurry comprises high purity fine metal oxides particles uniformly dispersed in a stable aqueous medium. Still another polishing slurry comprises a colloidal suspension of $SiO_2$ particles having an average particle size of between 20 and 50 nanometers in alkali solution, demineralized water, and a chemical activator. Energy change sensors are a preferred type of sensor for feed back of in situ control information. U.S. Pat. Nos. 5,209,816 to Yu et. al. issued in 1993, 5,354,490 to Yu et. al. issued in 1994, 5,?5408,810 to Sandhu et. al. issued in 1996, 5,516,346 to Cadien et. al. issued in 1996, 5,527,423 to Neville et. al. issued in 1996, 5,622,525 to Haisma et. al. issued in 1997, and 5,645,736 to Allman issued in 1997 comprise illustrative nonlimiting examples of slurries contained herein by reference in their entirety for further general guidance and modification by those skilled in the arts. Commercial CMP polishing slurries are also available from Rodel Manufacturing Company in Newark, Del. Application WO 98/18159 to Hudson gives general guidance for those skilled in the art for modifying current slurries to produce an abrasive free finishing composition.

In a preferred mode, the finishing composition is free of abrasive particles. However as the fixed abrasive finishing element wears down during finishing, some naturally worn fixed abrasive particles can be liberated from the fixed abrasive finishing element can thus temporarily be present in the finishing composition until drainage or removal.

Operative finishing motion

Chemical mechanical finishing during operation has the finishing element in operative finishing motion with the surface of the workpiece being finished. A relative lateral parallel motion of the finishing element to the surface of the workpiece being finished is an operative finishing motion. Lateral parallel motion can be over very short distances or macro-distances. A parallel circular motion of the finishing element finishing surface relative to the workpiece surface being finished can be effective. A tangential finishing motion can also be preferred. U.S. Pat. Nos. 5,177,908 to Tuttle issued in 1993, 5,234,867 to Schultz et. al. issued in 1993, 5,522,965 to Chisholm et. al. issued in 1996, 5,735,731 to Lee in 1998, and 5,962,947 to Talieh issued in 1997 comprise illustrative nonlimiting examples of operative finishing motion contained herein by reference in their entirety herein for further general guidance of those skilled in the arts.

Some illustrative nonlimiting examples of preferred operative finishing motions for use in the invention are also discussed. This invention has some particularly preferred operative finishing motions of the workpiece surface being finished and the finishing element finishing surface. Moving the finishing element finishing surface in an operative finishing motion to the workpiece surface being finished is a preferred example of an operative finishing motion. Moving the workpiece surface being finished in an operative finishing motion to the finishing element finishing surface is a preferred example of an operative finishing motion. Moving the finishing element finishing surface in a parallel circular motion to the workpiece surface being finished is a preferred example of an operative finishing motion. Moving the workpiece surface being finished in a parallel circular motion to the finishing element finishing surface is a preferred example of an operative parallel. Moving the finishing element finishing surface in a parallel linear motion to the workpiece surface being finished is a preferred example of an operative finishing motion. Moving the workpiece surface being finished in a parallel linear motion to the finishing element finishing surface is a preferred example of an operative parallel. The operative finishing motion performs a significant amount of the polishing and planarizing in this invention.

High speed finishing of the workpiece surface with fixed abrasive finishing elements can cause surface defects in the workpiece surface being finished at higher than desirable rates because of the higher forces generated. As used herein, high speed finishing involves relative operative motion having an equivalent linear velocity of greater than 300 feet per minute and low speed finishing involves relative operative motion having an equivalent linear velocity of at most 300 feet per minute. The relative operative speed is measured between the finishing element finishing surface and the workpiece surface being finished. Supplying a lubricating aid between the interface of finishing element finishing surface and the workpiece surface being finished when high speed finishing is preferred to reduce the level of surface defects. Supplying a lubricating aid between the interface of a fixed abrasive cylindrical finishing element and a workpiece surface being finished is a preferred example of high speed finishing. Supplying a lubricating aid between the interface of a fixed abrasive belt finishing element and a workpiece surface being finished is a preferred example of high speed finishing. Nonlimiting illustrative examples of a belt finishing element and a cylindrical finishing element are found in patents U.S. Pat. No. 5,735,731 to Lee and U.S. Pat. No. 5,762,536 to Pant and which can be modified by those skilled in the art as appropriate. U.S. Pat. No. 5,735,731 to Lee and U.S. Pat. No. 5,762,536 to Pant are included herein by reference in their entirety.

Platen

The platen is generally a stiff support structure for the finishing element. The platen surface facing the workpiece surface being finished is parallel to the workpiece surface being planarized and is flat and generally made of metal. The platen reduces flexing of the finishing element by supporting the finishing element, optionally a pressure distributive element can also be used. The platen surface during polishing is in operative finishing motion to the workpiece surface being finished. The platen surface can be static while the workpiece surface being finished is moved in an operative finishing motion. The platen surface can be moved in a parallel motion fashion while the workpiece surface being finished is static. Optionally, both the platen surface and the workpiece being finished can be in motion in a way that creates operative finishing motion between the workpiece and the finishing element. Other types of platens are generally known in the industry and functional.

Base support structure

The base support structure forms structure which can indirectly aid in applying pressure to the workpiece surface being finished. It generally forms a support surface for those members attached to it directly or operatively connected to the base support structure. Other types of base support structure are generally known in the industry and functional.

Workpiece finishing sensor

A workpiece finishing sensor is a sensor which senses the finishing progress to the workpiece in real time so that an in situ signal can be generated. A workpiece finishing sensor is preferred. A workpiece finishing sensor which facilitates measurement and control of finishing in this invention is preferred. A workpiece finishing sensor probe which generates a signal which can be used cooperatively with the secondary friction sensor signal to improve finishing is more preferred.

The change in friction during finishing can be accomplished using technology generally familiar to those skilled in the art. A change in friction can be detected by rotating the workpiece being finished and the finishing element finishing surface with electric motors and measuring current changes on one or both motors. The current changes related to friction changes can then be used to produce a signal to operate the finishing control subsystem. A change in friction can be detected by rotating the workpiece finishing surface with the finishing element finishing surface with electric motors and measuring power changes on one or both motors. Changes in friction can also be measured with thermal sensors. A thermistor is a non-limiting example of preferred non-optical thermal sensor. A thermal couple is another preferred non-optical thermal sensor. An optical thermal sensor is a preferred thermal sensor. A infrared thermal sensor is a preferred thermal sensor. A sensors to measure friction in workpieces being finished are generally known to those skilled in the art. Non limiting examples methods to measure friction in friction sensor probes are described in the following U.S. Pat. Nos. 5,069,002 to Sandhu et. al., 5,196,353 to Sandhu, 5,308,438 to Cote et. al., 5,595,562 to Yau et. al., 5,597,442 to Chen, ?564,050 to Chen, and 5,738,562 to Doan et. al. and are included by reference herein in their entirety for guidance and can be advantageously modified by those skilled in the art for use in this invention. Thermal sensors are available commercially from Terra Universal, Inc. in Anaheim, Calif. and Hart Scientific in American Fork, Utah. Measuring the changes in friction at the interface between the workpiece being finished and the finishing element finishing surface to generate an in situ signal for control is particularly preferred because the it can be effectively combined with a secondary friction sensor further improve finishing control.

A workpiece finishing sensor for the workpiece being finished is preferred. A sensor for the workpiece being finished selected from the group consisting of friction sensors, thermal sensors, optical sensors, acoustical sensors, and electrical sensors are preferred sensors for the workpiece being finished in this invention. Workpiece thermal sensors and workpiece friction sensors are non-limiting examples of preferred workpiece friction sensors. As used herein, a workpiece friction sensor can sense the friction between the interface of the workpiece being finished and the finishing element finishing surface during operative finishing motion.

Additional non-limiting preferred examples of workpiece finishing sensors will now be discussed. Preferred optical workpiece finishing sensors are discussed. Preferred non-optical workpiece finishing sensors are also discussed. The endpoint for planarization can be effected by monitoring the ratio of the rate of insulator material removed over a particular pattern feature to the rate of insulator material removal over an area devoid of an underlying pattern. The endpoint can be detected by impinging a laser light onto the workpiece being polished and measuring the reflected light versus the expected reflected light as an measure of the planarization process. A system which includes a device for measuring the electrochemical potential of the slurry during processing which is electrically connected to the slurry, and a device for detecting the endpoint of the process, based on upon the electrochemical potential of the slurry, which is responsive to the electrochemical potential measuring device. Endpoint detection can be determined by an apparatus using an interferometer measuring device to direct at an unpatterned die on the exposed surface of the wafer to detect oxide thickness at that point. A semiconductor substrate and a block of optical quartz are simultaneously polished and an interferometer, in conjunction with a data processing system are then used to monitor the thickness and the polishing rate of the optical block to develop an endpoint detection method. A layer over a patterned semiconductor is polished and analyzed using optical methods to determine the end point. An energy supplying means for supplying prescribed energy to the semiconductor wafer are used to develop a detecting means for detecting a polishing end point tot the polishing of film by detecting a variation of the energy supplied tot the semiconductor wafer. The use of sound waves can be used during chemical mechanical polishing by measuring sound waves emanating from the chemical mechanical polishing action of the substrate against the finishing element. A control subsystem can maintain a wafer count, corresponding to how many wafers are finished and the control subsystem regulates the backside pressure applied to each wafer in accordance with a predetermined function such that the backside pressure increases monotonically as the wafer count increases. The above methods are generally known to those skilled in the art. U.S. Pat. Nos. 5,081,796 to Schultz, 5,439,551 to Meikle et al., 5,461,007 to Kobayashi, 5,413,941 to Koos et. al., 5,637,185 Murarka et al., 5,643,046 Katakabe et al., 5,643,060 to Sandhu et al., 5,653,622 to Drill et al., and 5,705,435 to Chen. are included by reference in their entirety and included herein for general guidance and modification by those skilled in the art.

Changes in lubrication, particularly active lubrication, at the operative finishing interface can significantly affect finishing rates and finishing performance in ways that current workpiece finishing sensors cannot handle as effectively as desired. For instance, current workpiece finishing sensors are less effective for monitoring and controlling multiple real time changes in lubrication, particularly active lubrication, and changes in finishing such as finishing rates. This renders prior art workpiece finishing sensors less effective for lubricating boundary layer for controlling and stopping finishing where friction is adjusted or changed in real time. Secondary friction sensor subsystems as indicated above can help to improve real time control wherein the lubrication is changed during the finishing cycle time. Preferred secondary friction sensors include optical friction sensors and non-optical friction sensors. An optical friction sensor is a preferred friction sensor. Non-limiting preferred examples of optical friction sensors is an infrared thermal sensing unit such as a infrared camera and a laser adjusted to read minute changes of movement friction sensor probe to a perturbation. A non-optical sensing friction sensor is a preferred friction sensor. Non-limiting preferred examples of non-optical friction sensors include thermistors, thermocouples, diodes, thin conducting films, and thin metallic conducting films. Electrical performance versus temperature such as conductivity, voltage, and resistance is measured. Those skilled in the thermal measurement arts are generally familiar with non-optical thermal sensors and their use. A change in friction can be detected by rotating the friction sensor in operative friction contact with the finishing element finishing surface with electric motors and measuring current changes on one or both motors. The current changes related to friction changes can then be used to produce a signal to operate the friction sensor subsystem. Secondary friction detectors can be used to sense changes in friction and tangential friction forces. Some illustrative secondary friction sensor motions are pulsed direction changes, pulsed pressure changes, continuous motion such as circular, elliptical, and linear. An operative secondary friction sensor motion is an operative secondary friction sensor motion between the secondary friction sensor surface and the finishing element finishing surface. An absolute motion of the secondary friction sensor is preferred. A secondary friction detector comprises a probe that can sense friction at the interface between a material which is separated from the workpiece surface being finished. A preferred secondary friction detector is friction sensor probe. A friction sensor probe comprises a probe that can sense friction at the interface between a material which is separate and unconnected to the workpiece surface being finished and the finishing element finishing surface. Details of secondary friction sensors and their use is found in Provisional Patent Application with PTO Ser. No. 60/107,300, private serial number NDTLBD1198a filed on the Nov. 6, 1998 and having the title "In Situ Friction Detector for finishing workpieces" and in a Regular Patent Application with private serial number 1DTL11599 filed on the same date as this application and having the title "In Situ Friction Detector for finishing semiconductor wafers" and they are included in their entirety by reference for general guidance and modification of those skilled in the art. Where the material changes with depth during the finishing of workpiece being finished, one can monitor friction changes with the secondary friction sensor having dissimilar materials even with active lubrication and therefore readily detect the end point. As an additional example, the finishing rate can be correlated with the instantaneous lubrication at the operative finishing interface, a mathematical equation can be developed to monitor finishing rate with instantaneous lubrication information from the secondary sensor and the processor then in real time calculates finishing rates and indicates the end point to the controller.

Process control parameters

Preferred process control parameters include those control parameters which can be changed during processing and affect workpiece finishing. Control of the operative finishing motion is a preferred process control parameter. Examples of preferred operative finishing motions include relative velocity, pressure, and type of motion. Examples of preferred types of operative finishing motion include tangential motion, planar finishing motion, linear motion, vibrating motion, oscillating motion, and orbital motion. Finishing temperature is a preferred process control parameter. Finishing temperature can be controlled by changing the heat supplied to the platen or heat supplied to the finishing composition. Alternately, friction can also change the finishing temperature and can be controlled by changes in lubrication, applied pressure during finishing, and relative operative finishing motion velocity. Changes in lubricant can be effected by changing finishing composition(s) and/or feed rate(s). A preferred group of process control parameters consists of parameters selected from the group consisting of wafer relative velocity, platen velocity, polishing pattern, finishing temperature, force exerted on the operative finishing interface, finishing composition, finishing composition feed rate, and finishing pad conditioning.

Processor

A processor is preferred to help evaluate the workpiece finishing sensor information. A processor can be a microprocessor, an ASIC, or some other processing means. Processor preferably has computational and digital capabilities. Non limiting examples of processing information include use of various mathematical equations, calculating specific parameters, memory look-up tables or databases for generating certain parameters such as historical performance or preferred parameters or constants, neural networks, fuzzy logic techniques for systematically computing or obtaining preferred parameter values. Input parameter(s) can include information on current wafers being polished such as uniformity, expected polish rates, preferred lubricants(s), preferred lubricant concentrations, entering film thickness and uniformity, workpiece pattern. Further preferred non-limiting processor capabilities including adding, subtracting, multiplying, dividing, use functions, look-up tables, noise subtraction techniques, comparing signals, and adjusting signals in real time from various inputs and combinations thereof.

Use of information for feedback and controller

Controllers to control the finishing of workpieces are generally known in the art. Controllers generally use information at least partially derived from the processor to make changes to the process control parameters. A processor is preferably operatively connected to a sensor to gain current information about the process and the processor is also operatively connected to a controller which preferably controls the finishing control parameters. As used herein, a control subsystem is a combination of an operative sensor operatively connected to a processor which is operatively connected to a controller which in turn can change finishing control parameters.

An advantage of this invention is the additional degree of control it gives to the operator performing planarization and/or polishing. To better utilize this control, the use of feedback information to control the finishing control parameters is preferred and in situ control is more preferred. Controlling the finishing control parameters selected from the group consisting of finishing composition feed rates, finishing composition concentration, operative finishing motion, and operative finishing pressure is preferred to improve control of the finishing of the workpiece surface being finished and in situ control is more particularly preferred. Another preferred example of an finishing control parameter is to use a different finishing element for a different portion the finishing cycle time such as one finishing element for the planarizing cycle time and a different finishing element for the polishing cycle time. Workpiece film thickness, measuring apparatus, and control methods are preferred methods of control. Mathematical equations including those developed based on process results can be used. Finishing uniformity parameters selected from the group consisting of Total Thickness Variation (TTV), Focal plane deviation (FPD), Within-Wafer Non-Uniformity (WIW NU), and surface quality are preferred. Average cut rate is a preferred finishing rate control parameter. Average finishing rate is a preferred finishing rate control parameter. Controlling finishing for at least a portion of the finishing cycle time with a finishing sensor subsystem to adjust in situ at least one finishing control parameter that affect finishing results is a preferred method of control finishing. Information feedback subsystems are generally known to those skilled in the art. Illustrative non limiting examples of wafer process control methods include U.S. Pat. Nos. 5,483,129 to Sandhu issued in 1996, 5,483,568 to Yano issued in 1996, 5,627,123 to Mogi issued in 1997, 5,653,622 to Drill issued in 1997, 5,657,123 to Mogi issued in 1997, 5,667,629 to Pan issued in 1997, and 5,695,601 to Kodera issued in 1997 are included herein for guidance and modification by those skilled in the art and are included herein by reference in their entirety.

Controlling at least one of the finishing control parameters based on using secondary friction sensor information combined with workpiece finishing sensor information is preferred and controlling at least two of the finishing control parameters using a secondary friction sensor information combined with workpiece finishing sensor information is more preferred. Using a electronic finishing sensor subsystem to control the finishing control parameters is preferred. Feedback information selected from the group consisting of finishing rate information and product quality information such as surface quality information is preferred. Non-limiting preferred examples of process rate information include polishing rate, planarizing rate, and workpiece finished per unit time. Non-limiting preferred examples of quality information include first pass first quality yields, focal plane deviation, total thickness variation, measures of non uniformity. Non-limiting examples particularly preferred for electronics parts include Total Thickness Variation (TTV), Focal plane deviation (FPD), Within-Wafer Non-Uniformity (WIW NU), and surface quality.

In situ process control systems relying on workpiece finishing sensors are generally known to those skilled in the CMP industry. Commercial CMP equipment advertised by Applied Materials and IPEC reference some of this equipment.

Finishing element conditioning

A finishing element can be conditioned before use or between the finishing of workpieces. Conditioning a finishing element is generally known in the CMP field and generally comprises changing the finishing element finishing surface in a way to improve the finishing of the workpiece. As an example of conditioning, a finishing element having no basic ability or inadequate ability to absorb or transport a finishing composition can be modified with an abrasive finishing element conditioner to have a new texture and/or surface topography to absorb and transport the finishing composition. As a non-limiting preferred example, an abrasive finishing element conditioner having a mechanical mechanism to create a finishing element finishing surface which more effectively transports the finishing composition is preferred. The abrasive finishing element conditioner having a mechanical mechanism to create a finishing element finishing surface which more effectively absorbs the finishing composition is also preferred. A abrasive finishing element conditioner having a mechanical mechanism comprising a plurality of abrasive points which through controlled abrasion can modify the texture or surface topography of a finishing element finishing surface to improve finishing composition absorption and/or transport is preferred. An abrasive finishing element conditioner having a mechanical mechanism comprising a plurality of abrasive points comprising a plurality of diamonds which through controlled abrasion can modify the texture and/or surface topography of a finishing element finishing surface to improve finishing composition absorption and/or transport is preferred.

Modifying a virgin finishing element finishing surface with a finishing element conditioner before use is generally preferred. Modifying a finishing element finishing surface with a finishing element conditioner a plurality of times is also preferred. conditioning a virgin finishing element finishing surface can improve early finishing performance of the finishing element such as by exposing the lubricants. Modifying a finishing element finishing surface with a finishing element conditioner a plurality of times during it useful life in order to improve the finishing element finishing surface performance over the finishing cycle time by exposing new, unused lubricant, particularly new lubricant particles, is preferred. Conditioning a finishing surface by cleaning is preferred. Nondestruction conditioning is a preferred form of conditioning. Conditioning a finishing element finishing surface a plurality of times during it useful life can keep the finishing element finishing surface performance higher over its useful lifetime by exposing fresh lubricant particles to improve finishing performance is also preferred. Using feedback information, preferably information derived from a friction sensor probes, to select when to modify the finishing element finishing surface with the finishing element conditioner is preferred. Using feedback information, preferably information derived from a friction sensor probe, to optimize the method of modifying the finishing element finishing surface with the finishing element conditioner is more preferred. Use of feedback information is discussed further herein in other sections. When using a fixed abrasive finishing element, a finishing element having three dimensionally dispersed lubricants is preferred because during the finishing element conditioning process, material is often mechanically removed from the finishing element finishing surface and preferably this removal exposes fresh lubricants, particularly lubricant particulates, to improve finishing.

Nonlimiting examples of textures and topographies useful for improving transport and absorption of the finishing composition and/or finishing element conditioners and general use are given in U.S. Pat. Nos. 5,216,843 to Breivogel, 5,209,760 to Wiand, 5,489,233 to Cook et. al., 5,664,987 to Renteln, 5,655,951 to Meikle et. al., 5,665,201 to Sahota, and 5,782,675 to Southwick and are included herein by reference in their entirety for general background and guidance and modification by those skilled in the art.

Cleaning composition

After finishing the workpiece such as a electronic wafer, the workpiece must be carefully cleaned before the next manufacturing process step. A lubricant or abrasive particles remaining on the finished workpiece can cause quality problems later on and yield losses.

A lubricant which can be removed from the finished workpiece surface by supplying a water composition to the finished workpiece is preferred and a lubricant which can be removed from the finished workpiece surface by a hot water composition to the finished workpiece is also preferred. An example of a water composition for cleaning is a water solution comprising water soluble surfactants. An effective amount of lubricant which lowers the surface tension of water to help clean abrasive and other adventitious material from the workpiece surface after finishing is particularly preferred.

A lubricant which can be removed from the finished workpiece surface is preferred for many applications. A lubricant which can be removed from the finished workpiece surface by supplying deionized or pure water to the finished workpiece to substantially remove all of the lubricant is preferred and a lubricant which can be removed from the finished workpiece surface by supplying hot deionized or pure water to the finished workpiece to substantially remove all of the lubricant is also preferred. A lubricant which can be removed from the finished workpiece surface by supplying a deionized or pure water to the finished workpiece to completely remove the lubricant is more preferred and a lubricant which can be removed from the finished workpiece surface by supplying hot deionized or pure water to the finished workpiece in to completely remove the lubricant is also more preferred. Supplying a cleaning composition having a surfactant which removes lubricant from the workpiece surface just polished is a preferred cleaning step. A lubricant which lowers the surface tension of the water and thus helps remove any particles from the finished workpiece surface is preferred.

By using water to remove lubricant, the cleaning steps are lower cost and generally less apt to contaminate other areas of the manufacturing steps. A water cleaning based process is generally compatible with many electronic wafer cleaning process and thus is easier to implement on a commercial scale.

Cleaning composition

After finishing the workpiece such as a electronic wafer, the workpiece must be carefully cleaned before the next manufacturing process step. A lubricating aid or abrasive particles remaining on the finished workpiece can cause quality problems later on and yield losses.

A finishing aid which can be removed from the finished workpiece surface by supplying a water composition to the finished workpiece is preferred and a finishing aid which can be removed from the finished workpiece surface by supplying a hot water composition to the finished workpiece is also preferred. An example of a water composition for cleaning is a water solution comprising water soluble surfactants. An effective amount of lubricating aid which lowers the surface tension of water to help clean abrasive and other adventitious material from the workpiece surface after finishing is particularly preferred.

A lubricating aid which can be removed from the finished workpiece surface by supplying pure water to the finished workpiece to substantially remove all of the lubricating aid is preferred and a lubricating aid which can be removed from the finished workpiece surface by supplying hot pure water to the finished workpiece to substantially remove all of the lubricating aid is also preferred. A lubricating aid which can be removed from the finished workpiece surface by supplying a pure water to the finished workpiece to completely remove the lubricating aid is more preferred and a lubricating aid which can be removed from the finished workpiece surface by supplying hot pure water to the finished workpiece in to completely remove the lubricating aid is also more preferred. A preferred form of pure water is deionized water. Supplying a cleaning composition having a surfactant which removes lubricating aid from the workpiece surface just polished is a preferred cleaning step. A lubricating aid which lowers the surface tension of the water and thus helps remove any particles from the finished workpiece surface is preferred.

By using water to remove lubricating aid, the cleaning steps are lower cost and generally less apt to contaminate other areas of the manufacturing steps. A water cleaning based process is generally compatible with many electronic wafer cleaning process and thus is easier to implement on a commercial scale.

Further comments on method of operation

Some particularly preferred embodiments directed at the method of finishing are now discussed. The interface between the finishing surface finishing element and the workpiece being finished is referred to herein as the operative finishing interface.

Providing an abrasive finishing surface for finishing is preferred and providing an abrasive finishing element having a finishing surface for finishing is more preferred and providing an fixed abrasive finishing surface for finishing is even more preferred and providing an fixed abrasive finishing element having a finishing surface for finishing is even more particularly preferred. Fixed abrasive finishing generally produces less abrasive to clean from the workpiece surface that was finished. Providing the workpiece surface being finished proximate to the finishing surface is preferred and positioning the workpiece surface being finished proximate to the finishing surface is more preferred.

Supplying an operative finishing motion between the workpiece surface being finished and the finishing element finishing surface is preferred and applying an operative finishing motion between the workpiece surface being finished and the finishing element finishing surface is more preferred. The operative finishing motion creates the movement and pressure which supplies the finishing action such as chemical reactions, tribochemical reactions and/or abrasive wear. Applying an operative finishing motion that transfers the finishing aid to the interface between the finishing surface and the workpiece surface being finished is preferred and applying an operative finishing motion that transfers the finishing aid, forming a marginally effective lubricating layer between the finishing surface and the workpiece surface being finished is more preferred and applying an operative finishing motion that transfers the finishing aid, forming a marginally effective lubricating boundary layer between the finishing surface and the workpiece surface being finished is even more preferred. The lubrication at the interface reduces the occurrence of high friction and related workpiece surface damage. Applying an operative finishing motion that transfers the finishing aid, forming a lubricating boundary layer between at least a portion of the finishing surface and the semiconductor wafer surface being finished is preferred and applying an operative finishing motion that transfers the finishing aid, forming a marginally effective lubricating layer between at least a portion of the finishing surface and the semiconductor wafer surface being finished so that abrasive wear occurs to the semiconductor wafer surface being finished is more preferred and applying an operative finishing motion that transfers the finishing aid, forming a marginally effective lubricating boundary layer between at least a portion of the finishing surface and the semiconductor wafer surface being finished so that tribochemical wear occur to the semiconductor wafer surface being finished is even more preferred and applying an operative finishing motion that transfers the finishing aid, differentially lubricating different regions of the heterogeneous semiconductor wafer surface being finished even more particularly preferred. With heterogeneous workpiece surfaces, the potential to differentially lubricate and finish a workpiece surface has high value where the differential lubrication is understood and controlled.

Changing the pressure at the operative finishing interface can change the lubricating boundary layer performance. Changing the motion such as speed or type of motion can change the lubricating boundary layer performance. Changing the pressure applied in the operative finishing interface, either total pressure or regional pressure can change the lubricating boundary layer performance. Changing the temperature in the operative finishing interface, either average or regional temperatures can change the lubricating boundary layer performance. Changing the concentration of the boundary lubricant by changing finishing elements can change the lubricating boundary performance. Changing the chemistry of the boundary lubricant in the finishing element can change the lubricating boundary performance by changing finishing elements during the finishing cycle time can be a lubricating control parameter. The above parameters comprise preferred lubricating boundary layer control parameters and can be used to effect changes in the finishing of the workpiece surface being finished. Changing a lubricating boundary layer control parameter to change the tangential force of friction at the operative finishing interface is preferred and changing a lubricating boundary layer control parameter to change the tangential force of friction at a region in the operative finishing interface is more preferred and changing a lubricating boundary layer control parameter to change the tangential force of friction in at least two regions of the operative finishing interface is even more preferred. Changing a control parameter to change the tangential force of friction at the operative finishing interface is preferred and changing a control parameter to change the tangential force of friction at a region in the operative finishing interface is more preferred and changing a control parameter to change the tangential force of friction in at least two regions of the operative finishing interface is even more preferred. Changing the lubricating boundary control parameters at least once during the finishing cycle time is preferred and changing the lubricating control parameters at least twice during the finishing cycle time is more preferred. Changing the lubricating boundary layer control parameters in situ is preferred and changing the lubricating boundary layer control parameters in situ with a subsystem controller is more preferred and changing the lubricating boundary layer control parameters in situ with a controller based on a secondary friction sensor signal is even more preferred.

Changing at least one control parameter in situ is preferred and changing at least one control parameter in situ with a subsystem controller is more preferred and changing at least one control parameter in situ with a controller based on a friction sensor signal is even more preferred. Controlling at least one control parameter in situ is preferred and controlling at least one control parameter in situ with a subsystem controller is more preferred and controlling at least one control parameter in situ with a controller based on a friction sensor signal is even more preferred. Changing at least one control parameter in situ is preferred and changing at least one control parameter in situ with a subsystem controller is more preferred and changing at least one control parameter in situ with a controller based on a secondary friction sensor signal is preferred. Controlling at least one control parameter in situ is preferred and controlling at least one control parameter in situ with a subsystem controller is more preferred and controlling at least one control parameter in situ with a controller based on a secondary friction sensor signal is even more preferred.

Applying higher pressure in the unwanted raised region on the semiconductor wafer surface compared to pressure applied to the region below the unwanted raised region causing the boundary layer lubrication thickness to be less on the unwanted raised region and the boundary lubrication thickness to be greater on at least portion of the semiconductor wafer surface below the raised region is a preferred method for differential finishing rates. Applying higher pressure in the unwanted raised region on the semiconductor wafer surface compared to pressure applied to the region below the unwanted raised region causing the boundary layer lubrication thickness to be less on the unwanted raised region and a higher temperature on the unwanted raised region and the boundary lubrication thickness to be greater on at least portion of the semiconductor wafer surface below the raised region and a lower temperature is more preferred method for differential finishing rates.

Applying an operative finishing motion in the operative finishing interface forming an organic lubricating layer such that a tangential friction force is created in the operative finishing interface which is dependent on lubricant properties other than lubricant viscosity is preferred. Applying an operative finishing motion in the operative finishing interface forming an organic lubricating layer such that a tangential friction force is created in the operative finishing interface which depends on lubricant properties other than lubricant viscosity is preferred. Applying an operative finishing motion in the operative finishing interface forming a differential organic lubricating layer such that a plurality of different tangential friction forces are created in different regions of the operative finishing interface and wherein the plurality of the different tangential friction forces are dependent on lubricant properties other than lubricant viscosity is more preferred. Applying the greater tangential friction force in the unwanted raised region of the semiconductor wafer surface being finished and also applying the lower tangential friction force to a region below and proximate to the unwanted raised region of the semiconductor wafer surface being finished is also more preferred. By creating this type of lubricating layer, finishing of the semiconductor wafer can be accomplished with good finishing rates and reduced unwanted surface defects. Planarization can be improved. Within die nonuniformity can be improved.

A lubrication control parameter is a parameter which affects the lubrication of the operative finishing interface. A boundary lubrication control parameter is a parameter which affects the boundary lubrication in the operative finishing interface. A parameter selected from the group consisting of the lubricant chemistry, lubricant concentration, lubricant transfer rate, operative finishing interface temperature, operative finishing interface pressure, and operative finishing interface motion is a preferred group of lubricating boundary layer control parameters. A parameter selected from the group consisting of the local lubricant chemistry, local lubricant concentration, local lubricant feed rate, local operative finishing interface temperature, local operative finishing interface pressure, and local operative finishing interface motion is a preferred group of local lubricating boundary layer control parameters. A local operative finishing interface pressure and local lubricating boundary layer is the local pressure and lubrication as illustrated and described in FIG. 5 and 6 herein.

Supplying an organic lubricant for a portion of finishing cycle time is preferred. Supplying an organic lubricant for a secondary finishing step after a first finishing step free of lubricant can be preferred. Using two finishing steps, one with lubricant and one free of lubricant can reduce unwanted surface damage when finishing a semiconductor wafer. Using two finishing steps can also increase the finishing rate.

A finishing aid selected from the group consisting of a lubricating aid and chemically reactive aid and both being free of an encapsulating films is preferred. A finishing aid which reacts with the workpiece surface being finished is preferred and which reacts with a portion of the workpiece surface being finished is more preferred and which differentially reacts with heterogeneous portions of a workpiece surface being finished is even more preferred. By reacting with the workpiece surface, control of finishing rates can be improved and some surface defects minimized or eliminated. A finishing aid which reduces friction during finishing is also preferred because surface defects can be minimized.

Cleaning the workpiece surface reduces defects in the semiconductor later on in wafer processing.

Supplying a finishing aid to the workpiece surface being finished which changes the rate of a chemical reaction is preferred. Supplying a finishing aid to the workpiece surface being finished having a property selected from the group consisting of workpiece surface coefficient of friction, workpiece finish rate change, a heterogeneous workpiece surface having differential coefficient of friction, and a heterogeneous workpiece surface having differential finishing rate change which reduces unwanted damage to the workpiece surface is particularly preferred.

Using the method of this invention to finish a workpiece, especially a semiconductor wafer, by controlling finishing for a period of time with an electronic control subsystem connected electrically to the finishing equipment control mechanism to adjust in situ at least one finishing control parameter that affect finishing selected from the group consisting of the finishing rate and the finishing uniformity is preferred. Finishing control parameters are selected from the group consisting of the finishing composition, finishing composition feed rate, finishing temperature, finishing pressure, operative finishing motion velocity and type, and finishing element type and condition change are preferred. The electronic control subsystem is operatively connected electrically to the lubrication control mechanism. The measurement and control subsystem can be separate units and/or integrated into one unit. A preferred method to measure finishing rate is to measure the change in the amount of material removed in angstroms per unit time in minutes (.ANG./min). Guidance on the measurement and calculation for polishing rate for semiconductor part is found in U.S. Pat. No. 5,695,601 to Kodera et. al. issued in 1997 and is included herein in its entirety for illustrative guidance.

An average finishing rate range is preferred, particularly for workpieces requiring very high precision finishing such as in process electronic wafers. Average cut rate is used as a preferred metric to describe preferred finishing rates. Average cut rate is metric generally known to those skilled in the art. For electronic workpieces, such as wafers, a cut rate of from 100 to 25,000 Angstroms per minute on at least a portion of the workpiece is preferred and a cut rate of from 200 to 15,000 Angstroms per minute on at least a portion of the workpiece is more preferred and a cut rate of from 500 to 10,000 Angstroms per minute on at least a portion of the workpiece is even more preferred and a cut rate of from 500 to 7,000 Angstroms per minute on at least a portion of the workpiece is even more particularly preferred and a cut rate of from 1,000 to 5,000 Angstroms per minute on at least a portion of the workpiece is most preferred. A finishing rate of at least 100 Angstroms per minute for at least one of the regions on the surface of the workpiece being finished is preferred and a finishing rate of at least 200 Angstroms per minute for at least one of the materials on the surface of the workpiece being finished is preferred and a finishing rate of at least 500 Angstroms per minute for at least one of the regions on the surface of the workpiece being finished is more preferred and a finishing rate of at least 1000 Angstroms per minute for at least one of the regions on the surface of the workpiece being finished is even more preferred where significant removal of a surface region is desired. During finishing there are often regions where the operator desires that the finishing stop when reached such when removing a conductive region (such as a metallic region) over a non conductive region (such as a silicon dioxide region). For regions where it is desirable to stop finishing (such as the silicon dioxide region example above), a finishing rate of at most 1000 Angstroms per minute for at least one of the regions on the surface of the workpiece being finished is preferred and a finishing rate of at least 500 Angstroms per minute for at least one of the materials on the surface of the workpiece being finished is preferred and a finishing rate of at least 200 Angstroms per minute for at least one of the regions on the surface of the workpiece being finished is more preferred and a finishing rate of at least 100 Angstroms per minute for at least one of the regions on the surface of the workpiece being finished is even more preferred where significant removal of a surface region is desired. The finishing rate can be controlled lubricants and with the process control parameters discussed herein.

Using finishing of this invention to remove raised surface perturbations and/or surface imperfections on the workpiece surface being finished is preferred. Using the method of this invention to finish a workpiece, especially a semiconductor wafer, at a planarizing rate and/or planarizing uniformity according to a controllable set of operational parameters that upon variation change the planarizing rate and/or planarizing uniformity and wherein the operational parameters of at least two operational parameters are selected from the group consisting of the type of lubricant, quantity of lubricant, and time period lubrication is preferred. Using the method of this invention to polish a workpiece, especially a semiconductor wafer, wherein an electronic control subsystem connected electrically to an operative lubrication feed mechanism adjusts in situ the subset of operational parameters that affect the planarizing rate and/or the planarizing uniformity and wherein the operational parameters are selected from the group consisting of the type of lubricant, quantity of lubricant, and time period lubrication is preferred. The electronic control subsystem is operatively connected electrically to the operative lubrication feed mechanism.

Using the method of this invention to polish or planarize a workpiece, especially a semiconductor wafer, supplying lubrication moderated by a finishing element having at least two layers is preferred. More preferably the finishing element having at least two layers has a finishing surface layer which has a higher hardness than the subsurface layer. A finishing element having at least two layers has a finishing surface layer which has a lower hardness than the subsurface layer is preferred, particularly for polishing.

Finishing of a semiconductor wafer surface being finished a fixed abrasive finishing element having a finishing element surface layer having a lubricating aid therein and a fixed abrasive finishing surface further the fixed abrasive finishing element further having a finishing element subsurface layer free of lubricating aid therein a preferred finishing element. A fixed abrasive finishing element having a finishing element surface layer having a finishing surface, a dispersed lubricating aid, and fixed abrasive elements and the fixed abrasive finishing element further comprising a finishing element subsurface layer free of lubricating aid is more preferred. This can reduce costs in the manufacture of the finishing element by reducing the costs of incorporating the finishing aids such as lubricant throughout the entire thickness. Finishing with a finishing element wherein the finishing element has a uniform dispersed lubricants beyond the useful finishing element finishing surface thick used for finishing is preferred because then lubrication will be stable within a finishing cycle run and from run to run in during finishing of the expensive semiconductor wafers thus helping to reduce yield loss.

Summary

Illustrative nonlimiting examples useful technology have referenced by their patents numbers and all of these patents are included herein by reference in their entirety for further general guidance and modification by those skilled in the arts. The scope of the invention should be determined by the appended claims and their legal equivalents, rather than by the preferred embodiments and details is discussed herein.

I claim:

1. A method of finishing of a semiconductor wafer surface being finished comprising the steps of:

providing a finishing element having a fixed abrasive finishing surface and having an organic boundary lubricant therein which is free of encapsulating films;

positioning the semiconductor wafer surface being finished proximate to the finishing surface;

applying an operative finishing motion in an operative finishing interface comprising the interface between the fixed abrasive finishing surface and the semiconductor wafer surface being finished; and wherein applying the operative finishing motion transfers the organic boundary lubricant from the finishing surface to the operative finishing interface in a manner that forms an organic lubricating boundary layer of from 1 to 6 molecules thick.

2. A method of finishing of the semiconductor wafer surface being finished according to claim 1 wherein the organic boundary lubricating layer comprises an organic synthetic material.

3. A method of finishing of the semiconductor wafer surface being finished according to claim 1 further comprising an additional step of controlling the thickness of the organic lubricating boundary layer by changing at least one process control parameter in situ based on feedback information from a control subsystem.

4. A method of finishing of the semiconductor wafer surface being finished according to claim 1 wherein applying the operative finishing motion transfers the organic lubricant, forming a marginally effective organic lubricating boundary layer in the operative finishing interface so that abrasive wear occurs to the semiconductor wafer surface being finished.

5. A method of finishing of the semiconductor wafer surface being finished according to claim 1 wherein applying the operative finishing motion comprises transferring an organic lubricating boundary layer in the operative finishing interface, reducing the wear on the exposed fixed abrasive finishing surface during finishing.

6. A method of finishing of a heterogeneous semiconductor wafer surface being finished comprising the steps of:

providing a finishing element having a fixed abrasive finishing surface and having a dispersed organic boundary lubricant, the organic boundary lubricant being free of encapsulating films;

positioning the semiconductor wafer surface being finished proximate to the finishing surface;

applying an operative finishing motion in an operative finishing interface comprising the interface between the fixed abrasive finishing surface and the semiconductor wafer surface being finished; and wherein applying the operative finishing motion transfers the organic boundary lubricant from the finishing surface to the operative finishing interface forming an organic lubricating boundary layer of from 1 to 6 molecules thick.

7. A method of finishing of the semiconductor wafer surface being finished according to claim 6 wherein applying the operative finishing motion comprises the transferring of an effective amount of organic lubricating boundary layer, reducing the formation of unwanted surface defects on the semiconductor wafer surface being finished.

8. A method of finishing of the heterogeneous semiconductor wafer surface being finished according to claim 6 wherein the heterogeneous semiconductor surface has at least one unwanted raised region wherein the organic lubricating boundary layer thickness is less on the unwanted raised region and the organic lubricating boundary layer thickness is greater on at least a portion of the semiconductor surface below and proximate to the unwanted raised region.

9. A method of finishing of the heterogeneous semiconductor wafer surface being finished according to claim 6 wherein the heterogeneous semiconductor wafer surface has at least one unwanted raised region wherein the organic lubricating boundary layer thickness on the unwanted raised region is at most one half the molecular layer thickness of the organic lubricating boundary layer thickness below and proximate to the unwanted raised region.

10. A method of finishing of the heterogeneous semiconductor wafer surface being finished according to claim 6 wherein the heterogeneous semiconductor wafer surface has at least one unwanted raised region wherein the organic lubricating boundary layer thickness is at most one third the molecular layer thickness of the organic lubricating boundary layer thickness below and proximate to the unwanted raised region.

11. A method of finishing of the heterogeneous semiconductor wafer surface being finished according to claim 6 wherein the heterogeneous semiconductor wafer surface has at least a first region wherein the organic lubricating boundary layer thickness is at most one third the molecular layer thickness compared to the organic lubricating boundary layer thickness on a second, different region.

12. A method of finishing of the heterogeneous semiconductor wafer surface being finished according to claim 6 further comprising an additional step of controlling the thickness of the organic lubricating boundary layer by changing at least one lubrication control parameter in a manner that changes the tangential force of friction in at least two different regions of the operative finishing interface in response to an in situ control signal.

13. A method of finishing of the semiconductor wafer surface being finished according to claim 12 wherein applying the operative finishing motion comprises transferring and controlling the organic lubricating boundary layer in the operative finishing interface, reducing the wear on the exposed fixed abrasive finishing surface during finishing.

14. A method of finishing of the heterogeneous semiconductor wafer surface being finished according to claim 6 further comprising an additional step of controlling the thickness of the organic lubricating boundary layer by changing at least one control parameter in a manner that changes the tangential force of friction in at least two different regions of the operative finishing interface in response to an in situ control signal.

15. A method of finishing of a heterogeneous semiconductor wafer surface being finished according to claim 6 further comprising an additional step of controlling the thickness of the organic lubricating boundary layer by changing the lubrication control parameters in situ based on feed back information from a control subsystem having an energy change sensor.

16. A method of finishing of the semiconductor wafer surface being finished according to claim 15 wherein applying the operative finishing motion comprises transferring and controlling the organic lubricating boundary layer in the operative finishing interface, reducing the wear on the exposed fixed abrasive finishing surface during finishing.

17. A method of finishing of a heterogeneous semiconductor wafer surface being finished comprising the steps of:

providing a fixed abrasive finishing surface having a plurality of discrete, unconnected organic boundary lubricant regions free of encapsulating film;

positioning the semiconductor wafer surface being finished proximate to the finishing surface;

applying the operative finishing motion which transfers the organic boundary lubricant from the finishing surface to an operative finishing interface comprising the interface between the fixed abrasive finishing surface and the semiconductor wafer surface being finished forming a differential organic lubricating boundary layer in the operative finishing interface; and controlling the lubricating boundary layer film physical form by changing the lubrication control parameters in situ based on feed back information from a control subsystem having an operative sensor.

18. A method of finishing of the heterogeneous semiconductor wafer surface being finished according to claim 17 wherein:

the heterogeneous semiconductor wafer surface has unwanted raised surface regions; and the finishing element finishing surface comprises a composition having a synthetic resin with a flexural modulus of at least 20,000 psi when measured by ASTM 790 B at 73 degrees Fahrenheit; and a further step of increasing temperature on the unwanted raised region on the semiconductor wafer surface compared to the temperature on the region below the unwanted raised region forming the lubricating boundary layer liquid film on the unwanted raised region and the lubricating boundary layer solid film on at least a portion of the semiconductor wafer surface below the raised region.

19. A method of finishing of the heterogeneous semiconductor wafer surface being finished according to claim 18 wherein the unwanted raised region has a higher finishing rate measured in angstroms per minute and the region proximate to and below the unwanted raised region has lower finishing rate.

20. A method of finishing of the heterogeneous semiconductor wafer surface being finished according to claim 17 wherein the unwanted raised region has a higher finishing rate measured in angstroms per minute and the region proximate to and below the unwanted region has a lower finishing rate.

21. A method of finishing of a heterogeneous semiconductor wafer surface being finished comprising the steps of:

providing a finishing element having an abrasive finishing surface and having an organic boundary lubricant therein;

positioning the semiconductor wafer surface being finished proximate to the finishing surface;

applying an operative finishing motion in an operative finishing interface comprising the interface between the fixed abrasive finishing surface and the semiconductor wafer surface being finished; and wherein applying the operative finishing motion transfers the organic boundary lubricant from the finishing surface to the operative finishing interface forming a heterogeneous organic lubricating boundary layer of from 1 to 6 molecules thick on the semiconductor wafer surface wherein:

the operative finishing motion forms a friction in the interface between a uniform region on the semiconductor wafer surface and the finishing element finishing surface;

the organic lubricating boundary layer physically or chemically interacts with and adheres to the semiconductor wafer surface; and the friction formed between the uniform region on the semiconductor wafer surface and the finishing element finishing surface is determined by lubricant properties other than viscosity.

22. A method of finishing of the heterogeneous semiconductor wafer surface being finished according to claim 21 wherein the heterogeneous semiconductor surface has at least one unwanted raised region wherein the organic lubricating boundary layer thickness is at most one half the molecular layer thickness of the lubricating boundary layer thickness proximate to the unwanted raised region.

23. A method of finishing of the heterogeneous semiconductor wafer surface being finished according to claim 22 further comprising an additional step of controlling the thickness of the organic lubricating boundary layer by changing at least one control parameter in a manner that changes the tangential force of friction in at least two different regions of the operative finishing interface in response to an in situ control signal.

24. A method of finishing of the heterogeneous semiconductor wafer surface being finished according to claim 21 wherein the heterogeneous semiconductor wafer surface has at least one unwanted raised region wherein the organic lubricating boundary layer thickness is at most one quarter the molecular layer thickness of the lubricating boundary layer thickness proximate to the unwanted raised region.

25. A method of finishing of the heterogeneous semiconductor wafer surface being finished according to claim 24 further comprising an additional step of controlling the thickness of the organic lubricating boundary layer by changing at least one process control parameter in situ based on feed back information from a control subsystem.

26. A method of finishing of the heterogeneous semiconductor wafer surface being finished according to claim 21 wherein the heterogeneous semiconductor wafer surface has at least one unwanted raised region wherein the unwanted raised region has a finishing rate measured in angstroms per minute of at least 1.6 times faster than in the proximate low local region measured in angstroms per minute.

27. A method of finishing of the heterogeneous semiconductor wafer surface being finished according to claim 26 further comprising an additional step of controlling the thickness of the organic lubricating boundary layer by changing at least one control parameter in a manner that changes the tangential force of friction in at least two different regions of the operative finishing interface in response to an in situ control signal.

28. A method of finishing of the heterogeneous semiconductor wafer surface being finished according to claim 21 wherein the heterogeneous semiconductor wafer surface has at least one unwanted raised region wherein the unwanted raised regions have a finishing rate measured in angstroms per minute of from 2 to 300 times faster than in the proximate low local region.

29. A method of finishing of the heterogeneous semiconductor wafer surface being finished according to claim 28 further comprising an additional step of controlling the thickness of the organic lubricating boundary layer by changing at least one process control parameter in situ based on feedback information from a control subsystem.

30. A method of finishing of a semiconductor wafer surface having a conductive region being finished comprising the steps of:

providing an abrasive finishing element finishing surface;

providing an organic boundary lubricant between the finishing element finishing surface and the conductive region of the semiconductor wafer surface being finished; and applying an operative finishing motion between the semiconductor wafer surface being finished and the finishing element finishing surface forming a heterogeneous organic lubricating boundary layer of from 1 to 6 molecules thick on the conductive region of the semiconductor wafer surface wherein:

the operative finishing motion forms a friction in the interface between the conductive region on the semiconductor wafer surface and the finishing element finishing surface;

the organic lubricating boundary layer physically or chemically interacts with and adheres to the conductive region on the semiconductor wafer surface; and the friction formed between the conductive region on the semiconductor wafer surface and the finishing element finishing surface is determined by lubricant properties other than viscosity.

31. A method of finishing of the heterogeneous semiconductor wafer surface being finished according to claim 30 wherein the conductive region of the heterogeneous semiconductor surface has at least one unwanted raised region wherein the lubricating boundary layer thickness is at most one half the molecular layer thickness of the lubricating boundary layer thickness proximate to the unwanted raised region.

32. A method of finishing of the heterogeneous semiconductor wafer surface being finished according to claim 30 wherein the heterogeneous semiconductor wafer surface has at least one unwanted raised region wherein the unwanted raised regions have a finishing rate measured in angstroms per minute of from 2 to 300 times faster than in the proximate low local region.

33. A method of finishing of the heterogeneous semiconductor wafer surface being finished according to claim 32 further comprising an additional step of controlling the thickness of the organic lubricating boundary layer by changing at least one control parameter in a manner that changes the tangential force of friction in at least two different regions of the operative finishing interface in response to an in situ control signal.

34. A method of finishing of a heterogeneous semiconductor wafer surface having uwanted raised regions being finished comprising the steps of:

providing an abrasive finishing surface having a plurality of discrete, unconnected organic boundary lubricant regions free of encapsulating film;

positioning the semiconductor wafer surface being finished proximate to the finishing surface;

applying the operative finishing motion that transfers the organic boundary lubricant from the finishing surface to an operative finishing interface comprising the interface between the fixed abrasive finishing surface and the semiconductor wafer surface being finished forming a differential organic lubricating boundary layer in the operative finishing interface; and controlling the thickness of the organic lubricating boundary layer by changing at least one control parameter in a manner that changes the tangential force of friction in at least two different regions of the operative finishing interface in response to an in situ control signal.

35. A method of finishing of the heterogeneous semiconductor wafer surface having uwanted raised regions being finished according to claim 34 wherein:

the region being finished comprises a conductive region;

the conductive region of the heterogeneous semiconductor surface has at least one unwanted raised region wherein the lubricating boundary layer thickness is at most one half the molecular layer thickness of the lubricating boundary layer thickness proximate to the unwanted raised region; and the conductive region has at least one unwanted raised region's finishing rate measured in angstroms per minute of at least 2 times faster than the rate in the proximate low local region measured in angstroms per minute.

36. A method of finishing of the heterogeneous semiconductor wafer surface being finished according to claim 35 wherein the heterogeneous semiconductor wafer surface has a diameter of at least 300 mm.

37. A method of finishing of the heterogeneous semiconductor wafer surface having uwanted raised regions being finished according to claim 34 wherein:

the region being finished comprises a polymeric region;

the polymeric region of the heterogeneous semiconductor surface has at least one unwanted raised region wherein the lubricating boundary layer thickness is at most one half the molecular layer thickness of the lubricating boundary layer thickness proximate to the unwanted raised region; and the polymeric region has at least one unwanted raised region's finishing rate measured in angstroms per minute of at least 2 times faster than the rate in the proximate low local region measured in angstroms per minute.

38. A method of finishing of the heterogeneous semiconductor wafer surface being finished according to claim 37 wherein the heterogeneous semiconductor wafer surface has a diameter of at least 300 mm.

* * * * *